United States Patent
Suni et al.

(10) Patent No.: US 6,233,045 B1
(45) Date of Patent: May 15, 2001

(54) SELF-MIXING SENSOR APPARATUS AND METHOD

(75) Inventors: Paul J. M. Suni, Berthoud; Christian J. Grund, Boulder, both of CO (US)

(73) Assignee: Light Works LLC, Berthoud, CO (US)

( * ) Notice: Subject to any disclaimer, the term of this patent is extended or adjusted under 35 U.S.C. 154(b) by 0 days.

(21) Appl. No.: 09/311,920

(22) Filed: May 14, 1999

Related U.S. Application Data

(60) Provisional application No. 60/085,815, filed on May 18, 1998.

(51) Int. Cl.[7] ............................ G01C 3/08; H01S 3/098; H01S 3/00
(52) U.S. Cl. .................. 356/28.5; 356/4.01; 356/5.01; 356/5.1; 372/19; 372/33
(58) Field of Search .......................... 356/4.01, 5.01, 356/5.09, 5.1, 5.15, 28.5; 372/19, 33

(56) References Cited

U.S. PATENT DOCUMENTS

| | | |
|---|---|---|
| 3,892,483 * | 7/1975 | Saufferer . |
| 3,937,575 * | 2/1976 | Bateman . |
| 4,927,263 * | 5/1990 | de Groot et al. ............ 356/28.5 |
| 4,928,152 * | 5/1990 | Gerardin . |
| 5,020,901 * | 6/1991 | de Groot . |
| 5,260,562 * | 11/1993 | Bearden et al. . |
| 5,267,016 * | 11/1993 | Meinzer et al. . |
| 5,301,059 * | 4/1994 | Kitaoka et al. ................ 372/22 |
| 5,387,998 * | 2/1995 | Kitaoka et al. . |
| 5,594,543 * | 1/1997 | de Groot et al. ............ 356/5.09 |

* cited by examiner

*Primary Examiner*—Stephen C. Buczinski
(74) *Attorney, Agent, or Firm*—Sheridan Ross P.C.

(57) ABSTRACT

A self-mixing sensor usable for remotely measuring speed, vibrations, range, and length is provided in a manner making the device practical for economic implementation while retaining accuracy. In one embodiment, the device is configured to avoid mode hopping, such as by providing for relatively high loss for all modes other than the desired mode. Preferably this is accomplished by utilizing laser types that have a high degree of side mode supression, such as DFB lasers or through active or passive control of the amount of light permitted to reenter the laser.

60 Claims, 14 Drawing Sheets

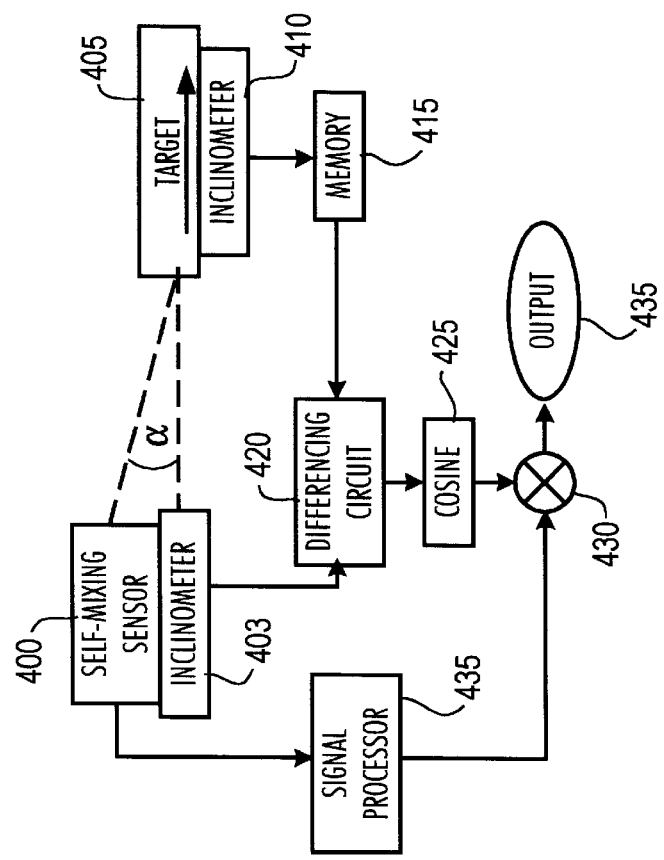
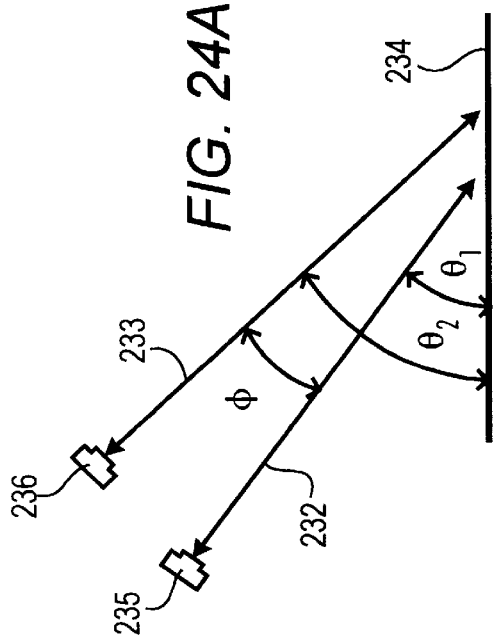
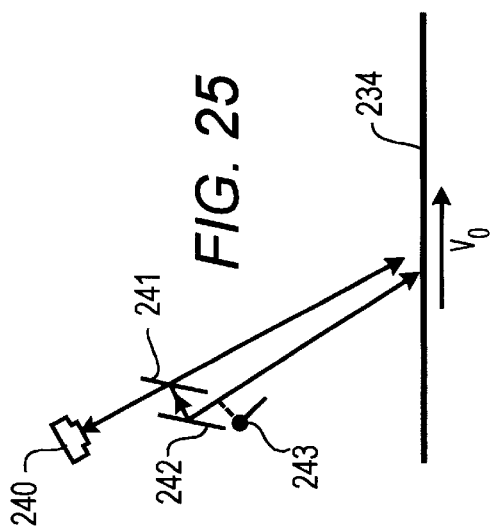

SELF-MIXING SENSOR APPARATUS AND METHOD

This application claims the benefit of Provisional No. 60/085,815 filed May 18, 1998.

The U.S. Government has a paid-up license in at least some aspects of this invention and the right in limited circumstances to require the patent owner to license others on reasonable terms or provided for by the terms of Contract No. NAS1 -20633 awarded by the National Aeronautics and Space Administration and Contract No. F33615-96-C-1888 awarded by the United States Air Force.

Cross reference is made to disclosure document No. 419765, received in the U.S. Patent and Trademark Office on May 19, 1997 and the disclosure document No. 432,032, received in the U.S. Patent and Trademark Office on Jan. 23, 1998, both titled "Improved Self-Mixing Sensor".

FIELD OF THE INVENTION

The present invention relates to apparatus for remotely measuring speed, vibrations, range, and displacements using laser light.

BACKGROUND INFORMATION

Measurement of range, vibration, or speed of an object can be done without physical contact between a sensor and the object. Optical non-contact measurements usually involves transmitting light from a laser to the object and measuring changes in light scattered from the object by suitable detection means. Self-mixing laser interferometry, also known as laser-feedback interferometry and backscatter modulation interferometry, has been known for some time, and some of the characteristics of such sensors have been described previously. In comparison with traditional laser radar and laser Doppler velocimeters, typical previous devices are very simple, the entire optical assembly typically consisting of a laser and a lens to focus light on or near an object whose properties are being measured. The apparent simplicity of the hardware offers potential to manufacture sensors at a relatively low cost compared with the alternative techniques, in particular coherent (heterodyne) laser radar. In its simplest form the self-mixing sensor relies on the fact that if light at a substantially fixed frequency is sent from a laser to an object, and if a fraction of the light scattered from the object is permitted to re-enter the laser, interference causes a modulation of the laser power. The amplitude of the modulation is dependent on the amount of scattered power coupled back into the laser. The modulation is at least partly dependent on the phase of the backscattered light relative to the phase of the light circulating in the laser cavity. If the relative phase varies in time, as is the case if the scattered light is shifted in frequency due, e.g., to the Doppler effect, the result is a periodic variation of the laser power with time. Detection of the periodicity through spectral analysis provides a direct measurement of the Doppler frequency. Since the Doppler frequency shift $f_{Doppler}$ is related to the speed of the object v as $f_{Doppler}=2v/\lambda$, where $\lambda$ is the laser wavelength, determination of the Doppler frequency directly leads to a determination of the object speed v. By introducing a known time-varying laser frequency shift, for example, where the transmitted laser frequency increases or decreases linearly with time, the range to a stationary or moving object can also be determined. In this case the time t between transmission and reception of light is given by $t=2L/c$, where L is the optical distance from the sensor to the target and c is the speed of light. If the laser frequency is varied at a rate df/dt, the sensor measures a frequency shift (df/dt) t if the object is stationary. If the object is moving, the detected frequency shift is $(df/dt) t \pm f_{Doppler}$, the + or − sign depending on whether the object is moving toward or away from the sensor, respectively. If the transmitted frequency is alternately moved up and down in a linear fashion, a measurement of the resulting two frequencies can permit determination of the range, speed, and direction of the object motion. Vibrations can also be detected using self-mixing sensors, since a vibration is simply motion with a velocity varying periodically in time. Length can also be measured by integrating the measured speed over time.

Early discussions of the self-mixing effect were given by D. M.Clunie and N. H.Rock (J. Sci. Instru., 41, pp. 489) in 1964 and M. J.Rudd (J. Sci. Instrum. Series 2, 1, pp.723) in 1968, where the researchers used a gas laser. Gas lasers were subsequently used also by Churnside (Appl. Optics 23, pp.61 and pp. 2097, 1984), Bearden and O'Neill (U.S. Pat. No. 5,260,562), and Hinz (U.S. Pat. No. 5,069,545). Such lasers are characterized by long laser cavities (typically on the order of 10 cm or more) and very high output coupler reflectivities (such as much greater than 90% in the case of HeNe lasers).

Self-mixing using semiconductor lasers (henceforth also called diode lasers) has been studied by several researchers. Shimizu (Appl. Optics 26, pp. 4541, 1987), Shinohara et al. (Appl. Optics, 25, pp. 1417, 1986), Meinzer et al. (U.S. Pat. No. 5,267,016), and deGroot et al. (Appl. Optics, 27, pp. 4475, 1988), describe various basic sensor aspects. DeGroot and Gallatin (Opt. Lett., 14, pp. 165, 1989) subsequently discussed the use of a long external cavity laser to enable measurements to a range of 50 m. As implemented, it is believed the laser required an optical spectrum analyzer and a feedback control system to keep the laser stable.

A previous patent to Gerardin (U.S. Pat. No. 4,928,152), as well as publications by Jentink et al. (Appl. Opt. 27, pp. 379, 1988), and Otsuka (Appl. Opt., 33, pp. 111, 1994) using a diode-pumped solid-state laser, improperly discuss the self-mixing effect as a conventional heterodyne mixing process. Wang et al. (J. Lightwave Techn., 12, pp. 1577, 1994) and Koelink et al. (Appl. Opt., 31, pp. 3401, 1992) note that at high feedback levels the laser can operate in multiple longitudinal modes.

Although the self-mixing phenomenon has been known for a relatively long time, several assumptions are usually made which limit the practical use of these sensors. For example, previously it was often assumed, that if a semiconductor diode laser is substituted in place of a gas laser, the sensor performance will not be strongly affected, in terms of sensitivity and dynamic range. Dynamic range refers to the ratio of the strongest signal that can be detected to the weakest detectable signal. We find that, with good design, the lower limit can approach the quantum limit. In this limit, the noise level is given by the expression hvB, where hv denotes the photon energy and B denotes the detection bandwidth. Previously, it was frequently (implicitly) assumed that the upper limit is determined by how much light can be collected and allowed to re-enter the laser cavity. This assumption is, however, incorrect. The upper limit is more frequently determined by the onset of external-cavity mode hopping, hereinafter referred to as EMH. If a laser is operating substantially on a single longitudinal mode (a single frequency), feedback perturbs the laser frequency, in addition to perturbing the laser power. If the feedback level is high enough and the phase of the returned light is changing with time, the laser may jump between different frequencies separated approximately by an integer number times the quantity c/2L, where L denotes the distance from the sensor to the target. In the case of a Fabry-Perot laser cavity, for reflectivity values below a limiting value $R_{max}$ given by the expression $$R_{\max} = \left(\frac{L_d}{L}\right)^2 \cdot \frac{R_{oc}}{(1-R_{oc})^2} \cdot \frac{1}{(1+\alpha^2)} \quad (1)$$

such EMH does not occur. Here $L_d$ denotes the optical length of the laser cavity, $R_{oc}$ denotes the laser output coupling mirror reflectivity, and $\alpha$ denotes the so-called linewidth enhancement parameter having a typical value in the range of 2–5. For external target reflectivity values in excess of $R_{max}$, EMH becomes important and may have a significant influence on the accuracy of measurements. It is evident from the above equation 1, that as the distance L increases, the maximum allowable value of $R_{max}$ decreases. It is also evident that $R_{max}$ can be increased by increasing the laser length $L_d$.

For gas lasers used at a modest distance, the combination of a large $R_{oc}$ and a large $L_d$ cause the upper limit on reflected light to be so high that the upper limit given by equation 1 is almost never encountered. Consequently, the EMH effect typically has not been discussed in the context of gas lasers. Furthermore, the EMH concept is believed unique to self-mixing sensors. Consequently, it typically has not been recognized by those authors who discuss the sensors as conventional heterodyne devices.

Among the prior authors who do note the existence of EMH, it is believed Wang makes no comments about whether the effect affects the sensor performance and shows no results to support any potential performance degradation. Koelink notes that under high feedback conditions, more noise results, and reducing the aperture can result in a larger signal without mention of attenuation effects or other possible rationales. It is believed no discussion is given of whether the issue is detrimental to unambiguous measurements, or how it can be circumvented.

In the one case where a long cavity diode laser has been fabricated, the device was put together in order to improve the coherence length of the laser source and hence extend the range of the sensor. The authors do not mention EMH, or it potential importance. The authors state that they used the long cavity to ensure a long coherence length of the source laser, but make no mention of the fact that a long laser may be more immune to high feedback levels. Having a sufficient coherence length is necessary, but not a sufficient requirement for operation at extended distances. In other words, it is believed a very short laser will never be highly suitable for very long range measurements, regardless of its coherence length.

It is believed the laser used by deGroot also does not enable low cost manufacturing. As discussed in the reference, the laser comprises a short diode laser together with an external mirror and control electronics to keep the laser properly aligned. Such lasers involve many precision components and are relatively expensive to fabricate.

Of fundamental importance is also that previously used diode laser devices are intrinsically unsuitable for sensor manufacturing. This is particularly true when the objective is to manufacture sensors with high speed or range resolution, high accuracy, and high reliability over long time periods. The detailed commercial device testing and research efforts of the present inventors have demonstrated that so-called Fabry-Perot lasers employed by previous researchers using diode lasers, are inadequate for practical commercial self-mixing sensors that employ diode lasers.

Accordingly, it would be advantageous to provide the means whereby lasers employing the self-mixing principle may be used to form the basis of practical, reliable, and commercially viable sensors, It would be further advantageous to improve the dynamic range of diode-laser based self- mixing sensors and to prevent EMH from causing ambiguous measurements or measurements with decreased accuracy.

It would be further advantageous to achieve significantly higher sensitivity as well as variable attenuation, compared with the simplest form of the sensors discussed in the prior art previously.

It would be further advantageous to increase the detectability of weakly scattering objects, such as objects with low reflectivity, or small particles.

It would be further advantageous to enhance diode laser sensor operation at long ranges, without requiring the complications of optical spectral analysis discussed previously.

It would be further advantageous to achieve highly accurate speed measurements without requiring that the sensor is accurately aligned in angle to the target.

It would be further advantageous to obtain range and/or Doppler information from multiple spatial locations without the use of photo-detector arrays, as in the previous devices.

It would be further advantageous to design sensors that are highly reliable and highly manufacturable.

SUMMARY OF THE INVENTION

A self-mixing sensor usable for remotely measuring speed, vibrations, range, and length is provided in a manner making the device practical for economic implementation while retaining accuracy. In one embodiment, the device is configured to avoid mode hopping, such as by providing for relatively high loss for all modes other than the desired mode. Preferably this is accomplished by utilizing laser types that have a high degree of side-mode suppression, such as DFB lasers or through active or passive control of the amount of light permitted to reenter the laser.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

FIG. 24a illustrates a two-sensor geometry used to provide high accuracy sensing of linear speed.

FIG. 24b illustrates the combination of a single sensor with an inclinometer to provide high accuracy sensing of linear speed.

FIG. 25 illustrates a two-beam geometry using a single laser source.

DETAILED DESCRIPTION

Figure 1:
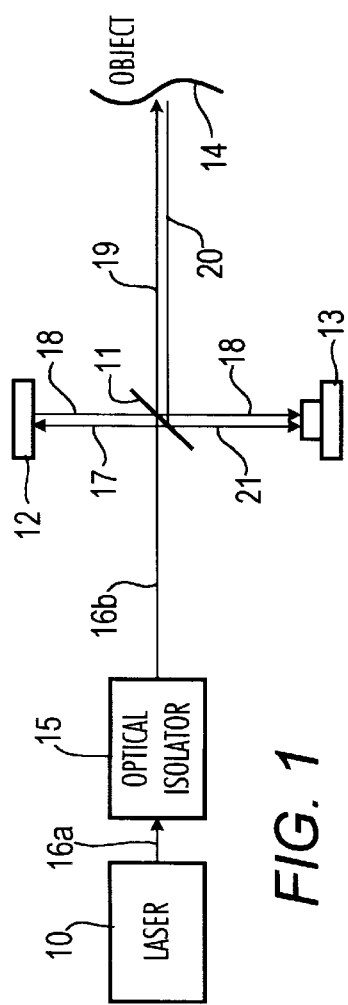
FIG. 1 shows the functional elements of a conventional heterodyne sensor.

In order to properly discuss the disclosed invention it is useful to also relate it directly to previous approaches. FIG. 1 shows a conventional heterodyne ("Michelson") interferometer configuration, where a light beam from a laser 10 is directed along a path 16a and 16b via optical isolator 15 to a beam splitter 11, where part of the light is directed along a path 17 to a mirror 12. Light reflected from the mirror along path 18 is partially transmitted through the beam splitter and impinges on photo-detector 13. Light is also transmitted in the forward pass from the laser along path 19, and is partially scattered from object 14 back along path 20. The beam splitter directs part of he light from path 18 along path 21 onto the detector 13. Although, for clarity, the light paths 18 and 21 are shown as spatially separated in the figure, the beams in actual interferometers must be carefully aligned in position and direction to achieve optical interference. If the object 14 is moving, a Doppler frequency shift exists between the light reflected from mirror 12 and the light scattered from the object 14. As is well known in the art, this results in a temporal variation of the power detected on photo-detector 13. The frequency of this power variation can be determined using conventional frequency spectrum analysis, and indicates the radial (along the direction of the laser beam) speed of the object toward or away from the sensor. The reflected light can be analyzed in a number of other fashions as well, such as detecting phase of said first light; detecting amplitude of said first light; detecting frequency content of said first light; detecting temporal evolution of the amplitude of said first light; detecting the width-of-signal of said first light in spectral space; detecting the signal to noise ratio; and/or detecting the number of peaks per unit time of said first light. To prevent the laser operation from being perturbed, it is common to place an optical isolator 15 between the laser and the beam splitter. This isolator 15 permits light to be transmitted from left to right in the figure, but substantially prevents light from passing through the isolator in the opposite direction. The heterodyne or Michelson interferometer scheme shown in FIG. 1 works well for speed detection and can be modified for range detection by varying the laser frequency in time, as is well-known in the art.

The main drawbacks with such heterodyne techniques are the need for expensive optical isolation, such as with optical isolator 15, the need for multiple high quality optical elements, such as mirror 12 and beam splitter 11, and highly precise alignment of all beam paths to ensure optimal sensor efficiency. A key feature of this type of system is that the detected signal power increases as the laser output power increases.

Figure 2:
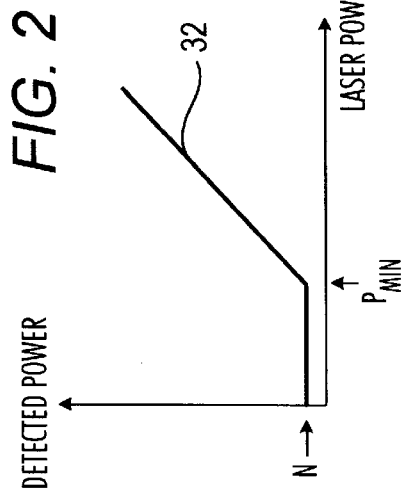
FIG. 2 is a typical plot of signal strength as a function of laser power for a conventional heterodyne sensor.

FIG. 2 shows a simplified graphical representation (in arbitrary unit) of signal power measured on a detector in relation to laser output power, at a given Doppler frequency. For laser power levels below a point denoted by $P_{min}$, the measured power is limited by noise in the detection system, denoted by the detected power level N. For laser power levels above this threshold value $P_{min}$, the detected power increases substantially linearly with increasing laser power, as indicated by plotted line 32.

Figure 4:
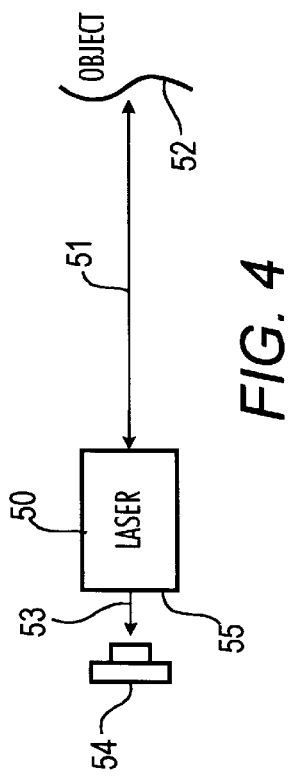
FIG. 4 shows a variation of a self-mixing sensor when a photo-detector is placed behind the laser.
Figure 3:
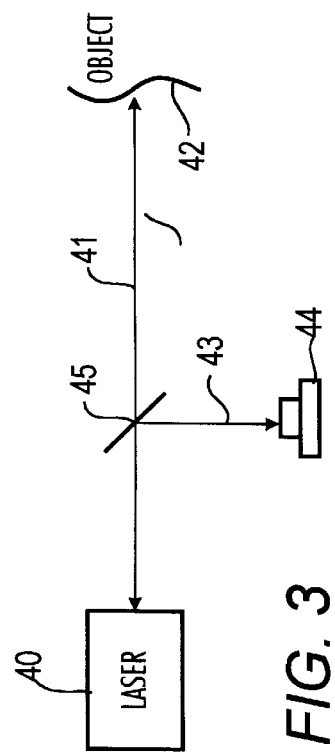
FIG. 3 shows the functional elements of a conventional self-mixing sensor.

The typical self-mixing configuration shown in FIG. 3 reduces the alignment requirements as compared to a heterodyne sensor. Here a laser 40 transmits light to an object 42 along path 41 through beam splitter 45. Scattered light is reflected along the same path 41 back into the cavity of laser 40, where it perturbs the laser oscillation in such a manner that the laser 25 exhibits output power fluctuations. If the phase of the light returned from object 42 into the laser 40 varies periodically at a Doppler frequency, the output power is also modulated at the same Doppler frequency. This power modulation can be detected by directing a portion of the light output along path 43, via beam splitter 45, to photo-detector 44. This arrangement eliminates the need for highly accurate alignments, since, if he object 42 is at least partially reflecting, a fraction of the light scattered from the object 42 will be scattered back along path 41. In an alternative configuration, shown in FIG. 4, the photo-detector 54 is placed behind the laser 50, and light transmitted as well as received along path 51 and scattered from object 52 is directed through a partially transmitting rear mirror 55 along path 53 to a photo-detector 54. This arrangement eliminates the need for the beam splitter 45 shown in FIG. 3.

Description of experiments by the Inventors

Figure 5:
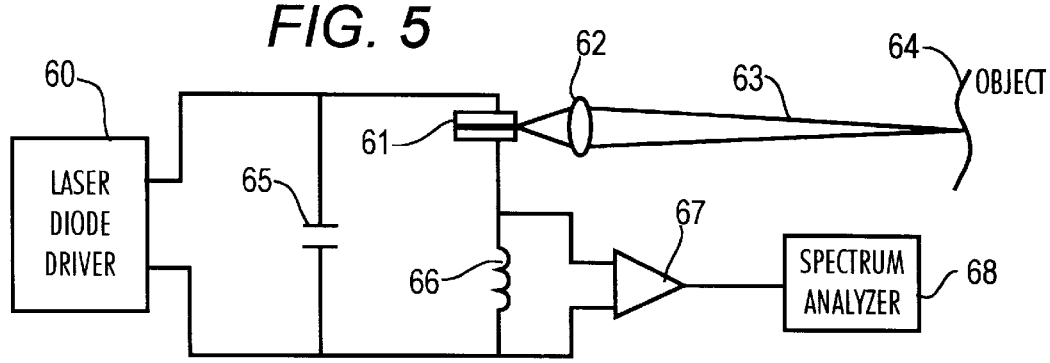
FIG. 5 shows a sensor system when the laser is a semiconductor diode laser and no separate detector is used, substantially as built and tested by the inventors.

It is also known in the prior art that a separate photo-detector is not needed to operate individual self-mixing sensors, particularly if the laser is a diode laser. A sensor, according to this invention, which eliminates the need for a separate photo-detector is shown in FIG. 5. In FIG. 5a current source 60 is used to drive the laser diode 61. Light from laser diode 61 is collected by lens 62 and focused along path 63 near the object 64. Scattered light returns to the laser diode and causes a temporally varying change in the diode laser junction impedance. Capacitor 65 provides a return path for the fluctuating component of the voltage across the series combination of diode laser 61 and inductor 66. The junction impedance changes in diode laser 61 discussed above then causes voltage fluctuations to appear across inductor 66. These fluctuation can be amplified by amplifier 67, and periodic variations can be measured using, for example, spectrum analyzer 68.

Figure 6:
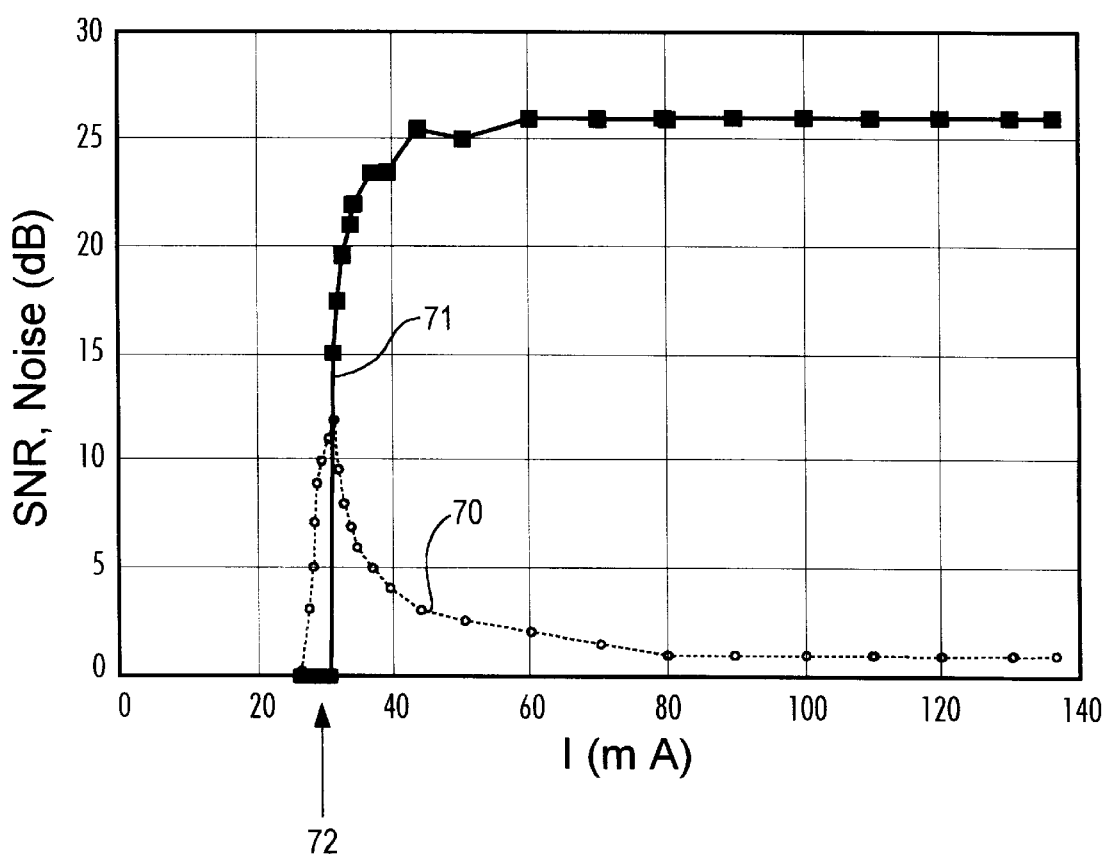
FIG. 6 shows a plot of log(signal power) and log(noise power) versus injection current for an SDL model 5301 diode laser.

FIG. 6 illustrates the variation of signal power and noise power (Signal-to-Noise Ratio or SNR) as a function of diode laser drive current (proportional to diode laser power) observed by the present inventors for a sensor using the configuration shown in FIG. 5. In this case the sensor used a model 531 1 -G 1 diode laser from SDL, Inc. (San Jose, Calif.) and the target object consisted of a rotating wheel covered with white paper placed approximately 1 m from the sensor. The rotating wheel impressed a substantially constant Doppler frequency shift on the reflected light. Laser threshold occurs near point 72 where the noise level, indicated by curve 70, increases rapidly with small increases in laser current. Near the same current level, the signal, indicated by curve 71, also rises quickly. As the laser current increases above the laser threshold value, the noise decreases rapidly while the signal level flattens out to a substantially constant value. This behavior is fundamentally different from that illustrated in FIG. 2 and is characteristic of self-mixing sensors.

FIG. 7 illustrates the behavior of the sensor in FIG. 5 under low and high feedback conditions. The amount of feedback was varied by inserting calibrated attenuation filters in the laser beam between the lens 62 and the object 64. The signal was again monitored using an RF spectrum analyzer 68. FIGS. 7a–d show the detected RF spectral signal peaks when 30 dB, 20 dB, 6 dB, and 0 dB round-trip attenuation respectively was used. In each spectrum analyzer photograph in FIG. 7, the horizontal scale measures frequency. The frequency span of the display is 2 MHZ, with the center of the display corresponding to a frequency value of 10 approximately 25 MHZ. The vertical scale indicates signal power, with the scale marker showing the display size corresponding to a 10 dB change in signal strength. In going from FIGS. 7a to 7b, the round-trip attenuation decreased by 10 dB and one can see that the signal increased approximately 10 dB. In this case the sensor responds linearly with increasing feedback signal magnitude. However, in FIG. 7c the attenuation was reduced a further 14 dB, but the signal does not show a significant increase in height. At the same time, the spectral width of the signal is clearly greater than in 7a or 7b. In FIG. 7d, finally, the attenuation was decreased a further 6 dB. The signal is now so wide that it is difficult to distinguish from the background noise, which is also increasing as the amount of attenuation is decreased. We estimate that the condition for the allowable reflectivity to prevent EMH according to equation 1 is exceeded between FIGS. 7b and 7c. Clearly, as the maximum allowable reflectivity is exceeded, the measured bandwidth broadens and the noise floor increases. Speed measurement accuracy is dependent both upon SNR and spectral width through the approximate proportionality $$\Delta v \, \Delta f / \sqrt{SNR},$$

where $\Delta v$ is the speed uncertainty and $\Delta f$ is the measured frequency uncertainty (width of the spectral line). When a sensor is used to measure range as discussed earlier, a similar expression relates range uncertainty to the measured frequency uncertainty and SNR. The indicated spectral broadening and reduction of SNR can therefore be detrimental to achieving a high measurement accuracy.

Figure 8A:
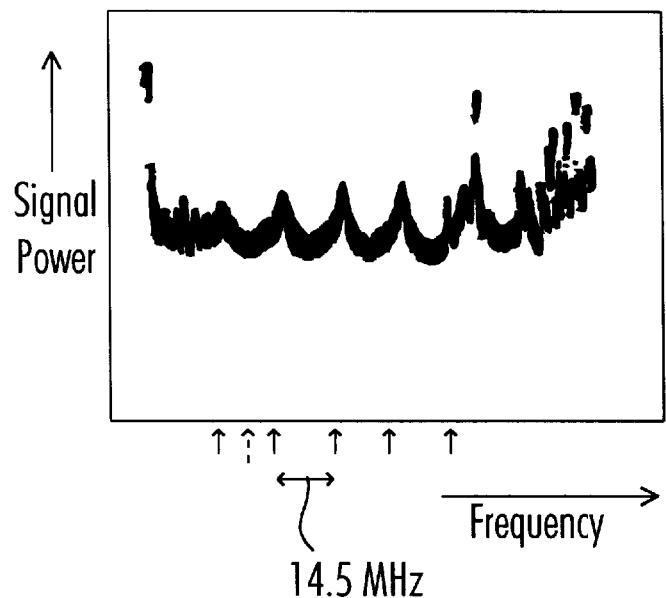
FIGS. 8a,b shows RF signal power (arbitrary but identical units) spectra at two levels of feedback when the target range is 10 m.
Figure 8B:
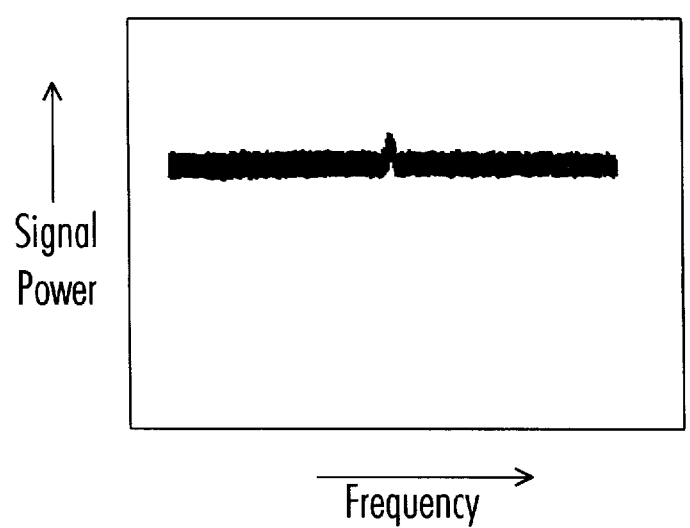

FIG. 8a shows RF spectra when the target is moved to a distance of approximately 10 m. With no laser beam attenuation, the RF spectrum shows a set of indicated peaks spaced approximately 14.5 MHZ apart, and indicated by vertical arrows in the figure. These spectral peaks correspond to the external cavity mode hopping (EMH) frequency for the approximately 10 m range used. Note that the peaks to the right and left of the indicated peaks are due to pickup of signal emanating from radio stations and other interfering sources and are not caused by the sensor. In the figure shown, there is no discernible trace of a Doppler peak which should have been present at the location of the vertical dashed arrow. However, by placing an attenuator in the laser path we can strongly reduce the magnitude of the EMH peaks, and in so doing the Doppler peak manifests itself as shown in FIG. 8b. The vertical scale is the same in FIGS. 8a and b, but the horizontal scale has been expanded in FIG. 8b.

From the measurements it is clear that under these circumstances, if an attenuator is used which can change the attenuation from a high value to a low value, while spectral measurements are being made, the Doppler peak would manifest itself first as the attenuation is decreased. Only at lower attenuation would the EMH spectral features appear. It is equally clear that a signal processor which only detects spectral peaks, in particular the lowest frequency peak, cannot distinguish between spectral features corresponding to EMH and Doppler shifts, particularly if the spectral regions where those features may both occur, as in the example of FIG. 8. For example, if the laser wavelength is 800 nm, an object moving at a radial speed of 5.8 m/s would cause a 14.5 MHZ Doppler shift, which, to the signal processor, would look identical to an EMH spectral feature from a non-moving object placed approximately 10 m from the sensor. The previous approach, in particular the apparatus of Gerardin, could not, it is believed, distinguish between these two cases, which would consequently cause false Doppler estimates under many common circumstances.

The following provides a description of an improved sensor using an optical attenuator. As demonstrated in the previous section, control of EMH is important to high performance self-mixing sensor operations. For fixed operations where little change in the operating conditions such as target range and reflectivity, can be expected, a simple fixed optical attenuator, such as a neutral density filter, may be selected for the application conditions, and fixed in place between the sensor and the target. However, for other common applications, the target range and/or reflectivity may be not be known. One method of providing automatic control of the target reflectivity to regulate self mixing sensor performance includes the following steps. First determine how much signal is acceptable without causing EMH. This is estimated using Equation 1 or through experimentation. Once this maximum signal level is determined, it is used as a reference level against which detected signals are compared. A second method measures the quiescent wideband noise of the laser diode and electronics, and uses fluctuations in that level to indicate and control the occurrence of EMH.

Figure 9:
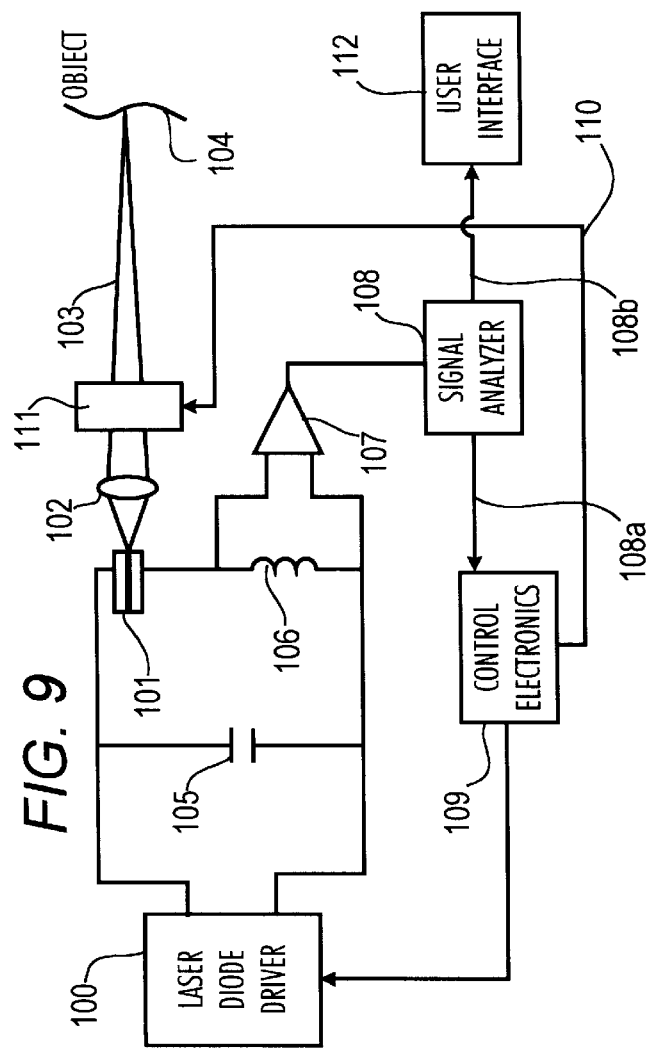
FIG. 9 shows the functional elements of an automatic control loop used to prevent the EMH-related performance degradation common to previous self-mixing sensors.

One embodiment of the invention incorporating both of these EMH control techniques is shown in FIG. 9. Control electronics 109 in conjunction with a laser diode driver 100 provide a substantially constant drive current to laser diode 101. Radiation from the diode laser 101 is collected and transmitted to object 104 along path 103 using lens 102. Feedback control element 111 is inserted in the optical path between the diode laser and the object. Feedback control element 111 may be any of the available electrically operable optical attenuator devices, selected to function at the laser wavelength, and suitable drivers. Suitable electrically operable optical attenuators are well known in the art, and include, but are not limited to, liquid crystal attenuators, shutters, electro-absorption filters, electro-optic modulators, and mechanically operated crossed polarizers. Capacitor 105 and an inductor 106 are used, as in FIG. 5, to enable coupling of AC signals into amplifier 107. The output of the amplifier consists of the Doppler signal plus wideband electronic noise from the laser and electronics. The Doppler signal is demodulated by a signal analyzer 108 which comprises a narrowband filter used to determine the amplitude of the Doppler signal within a select bandwidth. Such techniques are well known in the art and suitable methods may include, but are not limited to, narrowband filter constructions such as one or combination of phase-locked loops, digital filters implemented on a digitized version of the amplifier 107 output, or passive or active LC or RC filters. Signal rectification and magnitude determinations may be performed by, but are not limited to, synchronous or asynchronous AM detection, peak picking, or other common analog or digital techniques. The wideband signal +noise power may be determined by rectification and low pass filtering of the wideband signal present at the output of the amplifier 107. A signal representing the wideband signal+ noise is output to the control electronics 109 via wire 108a. The outputs of the signal analyzer 108 thus represent both the magnitude of the AC narrowband Doppler signal and the wideband signal noise induced by impedance variations in laser 101 and transmits said magnitudes to the control electronics 109.

Figure 7A:
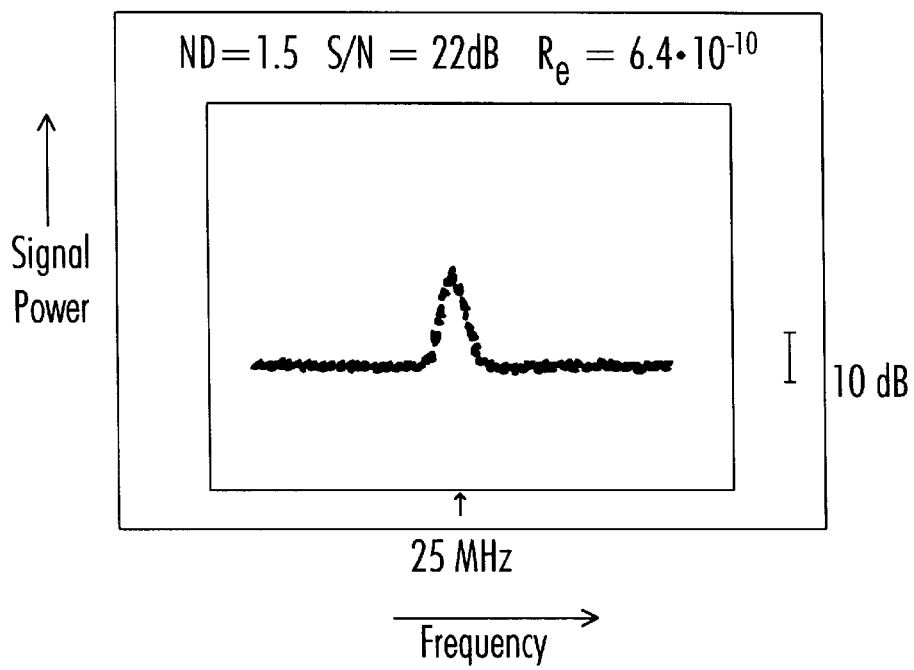
FIGS. 7a,b,c,d shows a sequence of detected spectral amplitude peaks (arbitrary but identical units) at four feedback levels at a target range of 10 m.
Figure 7B:
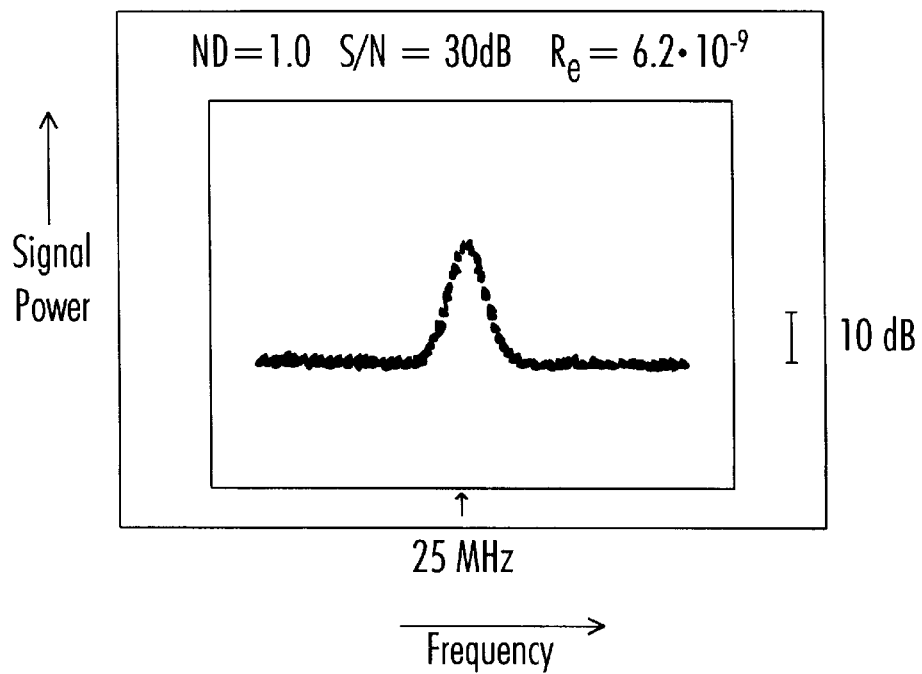
Figure 7C:
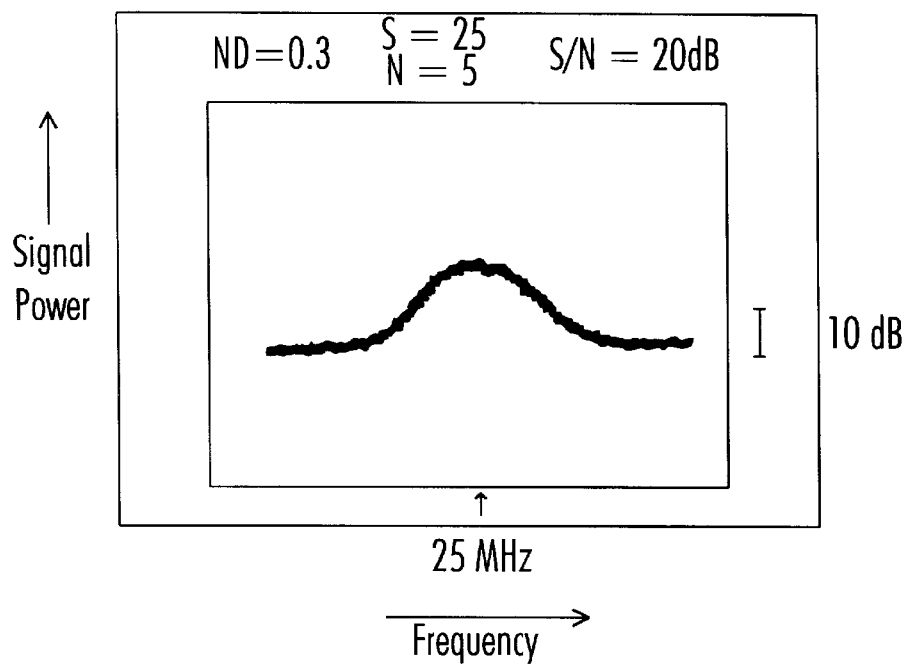
Figure 7D:
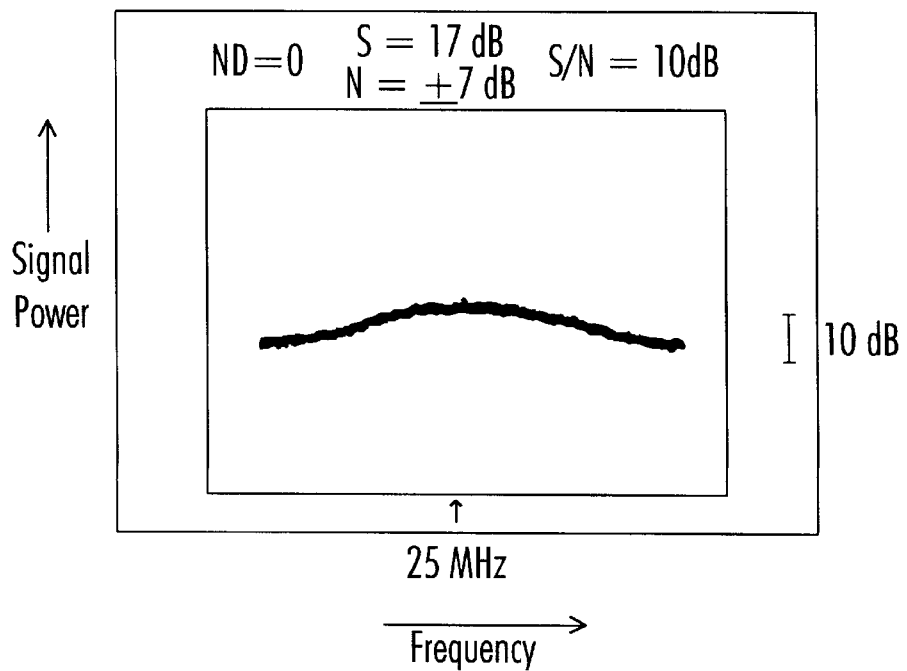

In the high feedback regime, as illustrated in FIGS. 7c and 7d, for example, EMH causes a broadband increase in the noise floor, which would manifest as an increase in the wideband signal+noise signal from the signal analyzer 108. If the wideband signal+noise magnitude exceeds a predetermined high limit value, a signal indicative of the high feedback condition is sent from control electronics 109 via wire 110 to the feedback control element 111 in order to increase the element 111 optical attenuation, thereby decreasing the amount of light reflected back into the laser. If the narrowband Doppler signal magnitude falls below a second predetermined value, a signal from control electronics 109 is sent via 110 to the feedback control element 111 to decrease attenuation in the light path between the laser 101 and the object 104, in order to increase the SNR. Continuous proportional control of the feedback control element 111 can be implemented using either or both narrowband and wideband signal magnitudes to provide as tightly controlled a s/n operating regime as desired for the particular application. If needed for stable operation of a particular laser 101, the control electronics 109 may also regulate the diode laser driver current to obtain improved signal to noise performance of the system.

Once the appropriate SNR has been set by the operation of the above control feedback loop, the signal analyzer 108 also transmits the Doppler signal, wideband signal+noise, and other analyzed information (such as Doppler frequency, power spectrum if calculated, etc.) to a user or computer interface 112 via wire 108b, which formats and scales the data, and presents the analyzed information, which may include, but is not limited to, vibration frequency or spectra, velocity, distance, or position, to a display terminal for human interface, and/or to electronic interfaces to facilitate automatic industrial process control.

Figure 10:
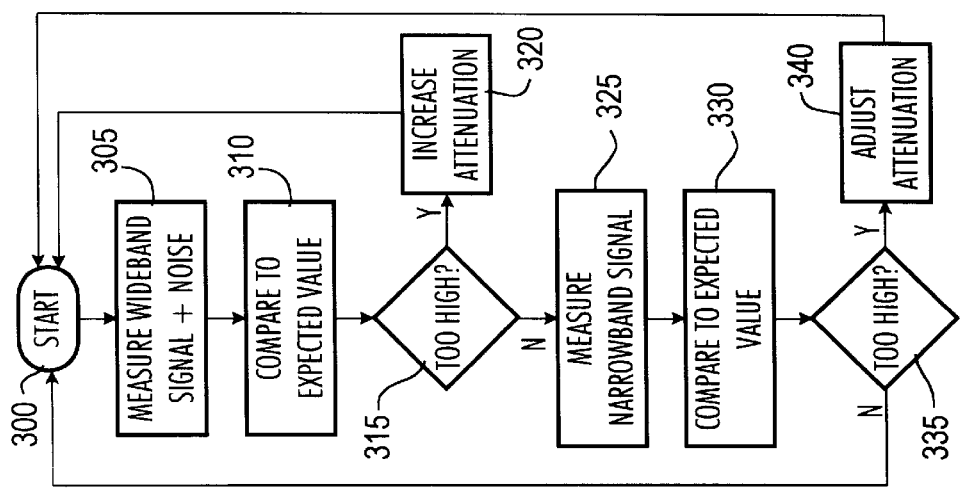
FIG. 10 shows the flow diagram for implementation of an automatic EMH control loop.

A preferred operational flow for implementation of the control loop outlined in connection with FIG. 9 is shown in FIG. 10. Logical flow begins at 300 and proceeds to 305, where the wideband (WB) signal+noise is measured, and proceeds to 310 where the WB signal+noise is compared to an expected threshold value from a sensor free of EMH. If the threshold value is exceeded, flow proceeds to 320 where the optical attenuation in the path between the sensor and the target is increased by a predetermined amount appropriate to eliminate the measured excess noise signal, and flow returns to 300. If at 315, the signal+noise was found within acceptable limits, flow proceeds to 325 where the narrowband signal strength is determined, and flow proceeds to 330 where this signal is compared to an expected value and flow proceeds to 335. If at 335 the narrowband signal is not within expected limits, flow proceeds to 340 where the attenuator is adjusted by a predetermined amount to approximately bring the signal within limits. If at 335 the signal was within acceptable limits, flow returns to 300 and begins again. This control loop function maintains the sensor-detected target reflectivity within the range appropriate for reliable sensor performance.

An alternative embodiment for implementing automatic optical feedback regulation incorporates digital processing of the sensor including the steps described below.

Figure 11:
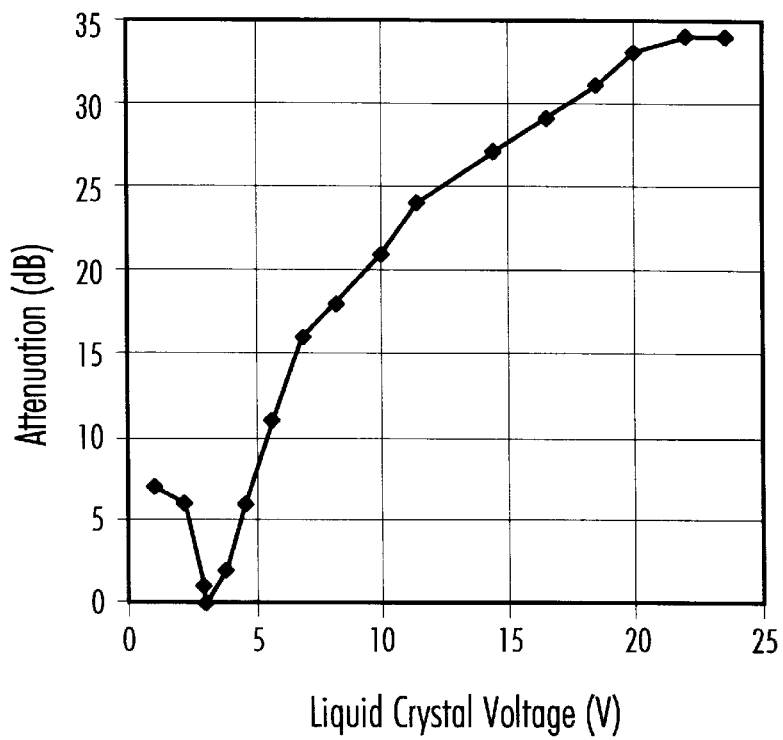
FIG. 11 shows a detailed view of a liquid crystal and polarizer used for electrically controlled attenuation.

An example of sensor attenuation measured using a liquid crystal attenuator placed between the lens and the target, relative to the liquid crystal applied voltage, is shown in FIG. 11. By varying the applied voltage between 0 V and 24 V, the attenuation could be varied by approximately 34 dB, thereby providing a method for compensating for high feedback levels.

Figure 12:
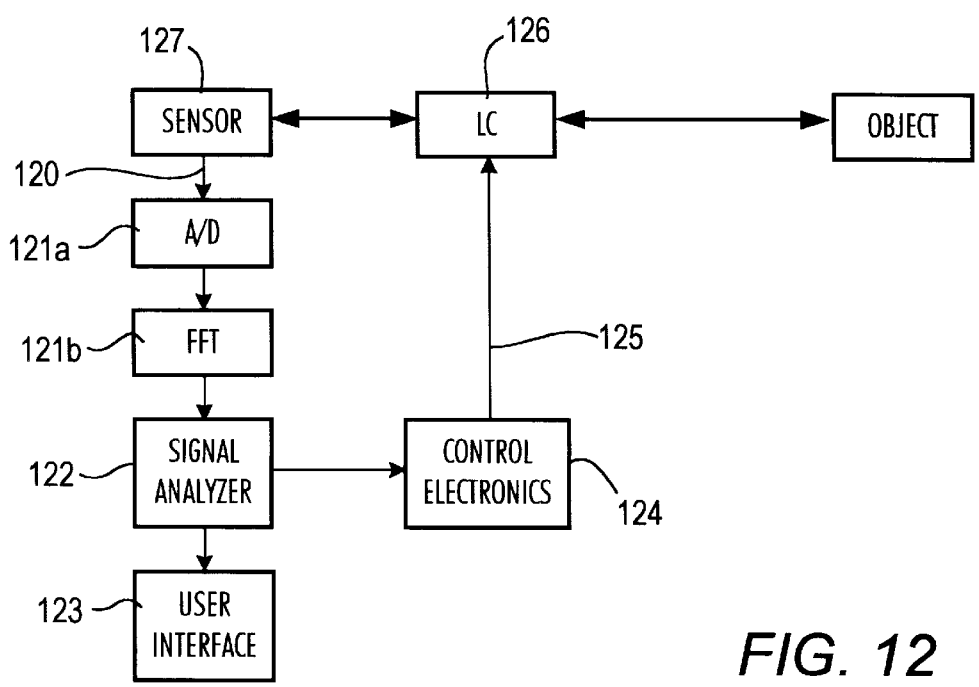
FIG. 12 shows signal-to-noise ratio versus liquid-crystal voltage for an electrically controlled liquid crystal attenuator.

A second embodiment implementing automatic EMH control using digitally processed feedback control is shown in FIG. 12. In FIG. 12 control electronics 124 outputs a control voltage 125, for example near 20 V, to a liquid crystal attenuator device 126, in order to provide a high degree of attenuation. The signal 120 from sensor 127, in the presence of this large attenuation, is converted to digital form by A/D converter 121a and injected into an FFT (Fast Fourier Transform) processor 121b. The FFT processor 121b can be effected in a specialized hardware processor, such as a DSP (Digital Signal Processor), or it may be implemented in software on a general purpose computer to perform an FFT calculation. The FFT processor calculates a power spectrum of the signal. The spectrum is then passed to a signal analyzer 122 which measures the presence of peaks in the spectrum above a predetermined noise level and below a predetermined maximum level. If a peak is detected, the corresponding frequency is output to a user interface 123. The user interface 123 can include a computer monitor or other local or remote readout and/or storage device, or it can be an electrical connection, such as an RS-232 or IEEE 488 connection to a remote process control computer.

If no peak is detected, the control signal 125 applied to the LC device 126 is changed to reduce the attenuation by a suitable amount, for example, 5 dB. A new signal then results, which is again processed by the FFT processor 121 and signal analyzer 122. This process is repeated until a spectral peak is found and output to the user interface 123. If no peak is detected at the lowest attenuation level, a signal indicating no detection may also be provided to the user interface 123. Numerous alternative implementations of the requisite electronics are readily apparent to those skilled in the art. One alternative is to use analog or digital circuitry to search for and lock onto a spectral peak. If that peak signal is varying in strength, a control loop can easily be implemented to increase or decrease the attenuation as required to keep the signal level within predetermined high and low limits. This technique is particularly well suited for tracking of signals which vary relatively slowly in frequency and strength.

Figure 13:
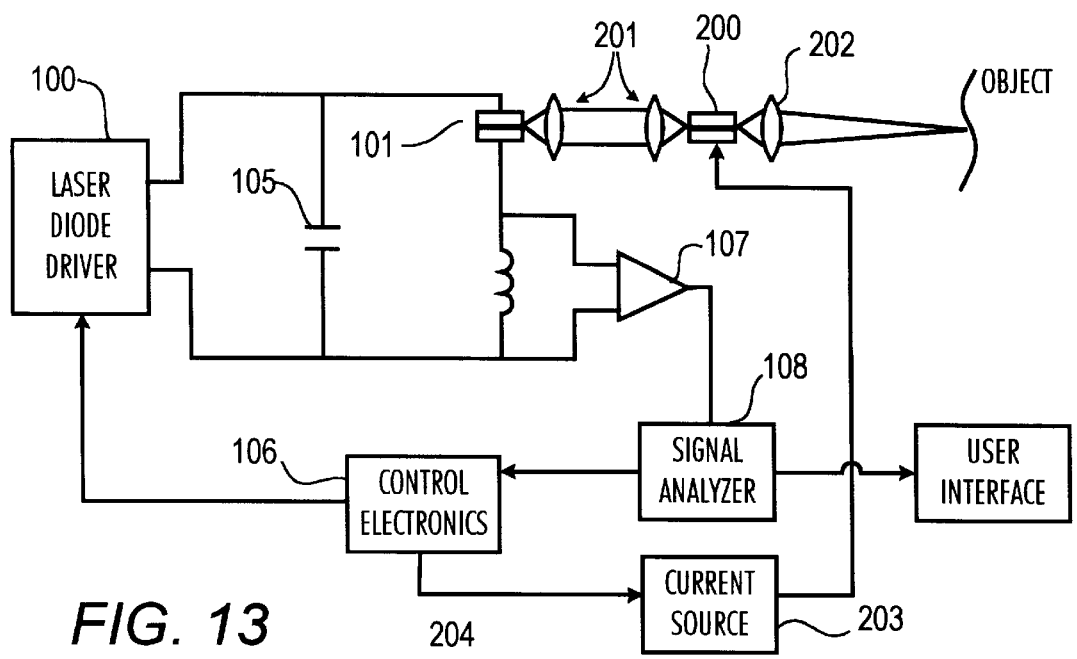
FIG. 13 shows he functional elements when a semiconductor diode amplifier is used for attenuation or gain.

The following provides a description of an improved sensor using an optical amplifier. In an alternative embodiment the feedback control element consists of a laser amplifier whose gain or loss can be controlled by applying a signal to the amplifier. When the sensor laser is a diode laser, the amplifier can be, for example, a semiconductor diode amplifier, or a doped optical fiber amplifier. The preferred configuration when a semiconductor diode amplifier (SDA) is utilized is shown in FIG. 13. The configuration has many elements in common with FIG. 9 and corresponding parts have been given the same numbers in both figures. In this configuration, the light from laser 101 is coupled into SDA element 200 through the use of one or more optical elements 201. In addition, secondary optical elements, such as a lens 202, are used to collect the light from the output of the SDA and focus it near the object. The control signal 204 is used to drive a current source 203 in order to produce a variable gain in the SDA. When no electrical current is applied to the SDA the amplifier is operating with a gain G<1, and the incident light is attenuated in passing through the SDA 200. At a particular level of current, termed the transparency level, the incident light is passed through the SDA with no loss and no amplification, corresponding to a net SDA gain G=1. At a current higher than the transparency level, the light output from the SDA is greater than the input level and the SDA is operating with a gain G>1. Gain is measured as the ratio of power coupled out from the SDA to the incident power. A great improvement in sensor dynamic range, as well as detection of weakly reflecting signals can be achieved with an SDA.

Figure 14:
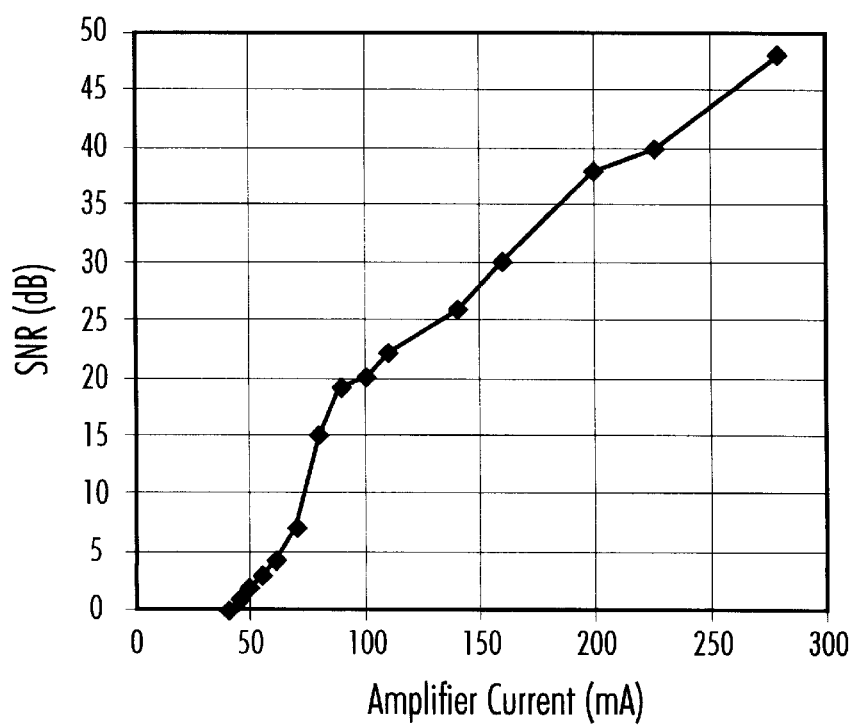
FIG. 14 shows measured signal-to-noise ratio as a function of amplifier current for an amplifier external to the laser cavity.

FIG. 14 shows a plot of measured signal-to-noise ratio as a function of injection current for an SDA manufactured by SDL, Inc. In the absence of the SDA element, the measured SNR was approximately 20 dB. With reference to FIG. 14 it can be seen that 20 dB SNR was detected at an SDA current near 100 mA. That current consequently defines the transparency point of the SDA. It can be seen that reduction of the SDA current to approximately 45 mA reduced the SNR by 20 dB, so the device can clearly be used as an attenuator. Similarly, by increasing the current to 280 mA, the signal increased by 28 dB with respect to the transparency point. This shows that the device can be used to increase signals, in addition to attenuating them. Since this device can amplify weak signals by 28 dB and also attenuate strong signal by 20 dB, the device can enable a 47 dB increase in dynamic range compared with a sensor not having an SDA present.

When an optical amplifier is used it is important that the input and output facets produce low reflections of power, preferably lower than $10^{-4}$, back towards the laser. A low reflectivity is particularly important for the output facet, since light reflected from that facet will be amplified in the return pass before re-entering the laser. If the amplifier has a single-pass gain G, which may be 10–100, and the output facet has a reflectivity Rf of $10^{-4}$, the power fraction reflected towards the laser could be 0.01 to 1.0. If the distance between the laser and amplifier is large, for example several cm, this could cause EMH between the laser and the amplifier. For this reason, the amplifier should be placed as close to the laser as possible, the exact distance being determined by a number of practical factors.

Figure 15:
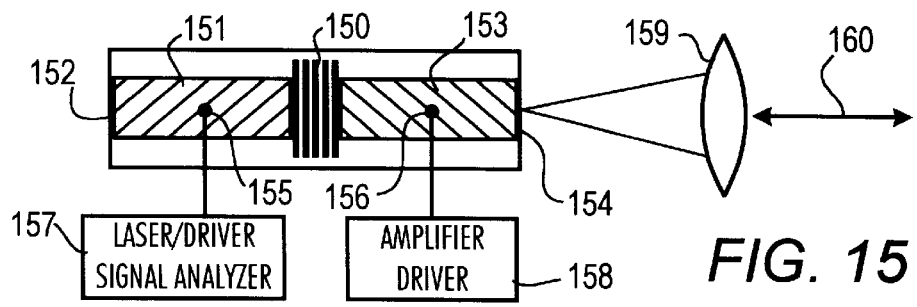
FIG. 15 shows a sensor element incorporating a laser section and an amplifier section on the same substrate.

One solution to this potential problem is to place the amplifier on the same substrate as the laser, as shown in FIG. 15. In this case the laser section 151 and amplifier section 153 are manufactured at the same time and are separated by a grating 150. The grating is designed as the output coupler of the laser section and provides a relatively low, for example less than 15%, reflectivity at the laser wavelength. The left end 152 of the laser section preferably is provided with a high reflectivity coating, although a second grating could be used in place of the coating in order to improve the single-frequency characteristics of the laser. The output end facet 154 of the amplifier should be designed to provide a low reflectivity, for example $10^{-4}$ or less, in order to scatter little light back towards the laser section. The amplified light from the amplifier is collected with an optic 159, such as a lens, and the laser light is directed towards the measurement object along a path 160. The laser diode driver and other requisite electronics 157 can be connected to the laser section through a wire bonded to the semiconductor, a technique which is well known in the art. An amplifier current source 158 is connected in a similar manner to the amplifier section. We note that this arrangement does not preclude using same current source for the laser and the amplifier.

Figure 16:
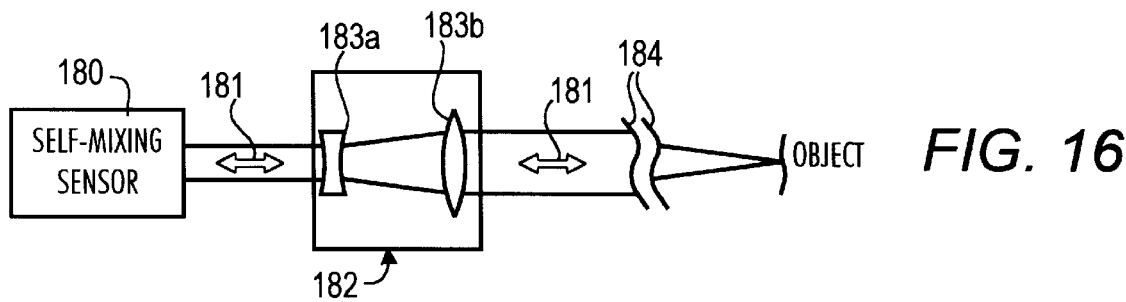
FIG. 16 shows a sensor configuration incorporating a beam expander.

In certain cases, for example if the target object is placed far from the sensor, it is desirable to place a beam expander between the sensor and the object. The advantage is that a larger transmitted beam can be used to focus the light to a smaller spot near the target and also that the amount of scattered light collected with the larger aperture increases. Both of these effects lead to an increased amount of power detected by the sensor. FIG. 16 shows one example of how such a configuration can be implemented. In the figure the self-mixing sensor 180 is shown as a single element. The laser light from the sensor is preferably, but not necessarily, collimated as it propagates along direction 181 to beam expander 182. The beam expander typically consists of several optical elements, for example two lenses 183a and 183b. At the output of the beam expander the transverse cross-section of the laser beam is larger than at the input, and this beam is transmitted to the object. Wavy lines 184 are used to indicate a break in the propagation path to the object.

Figure 17:
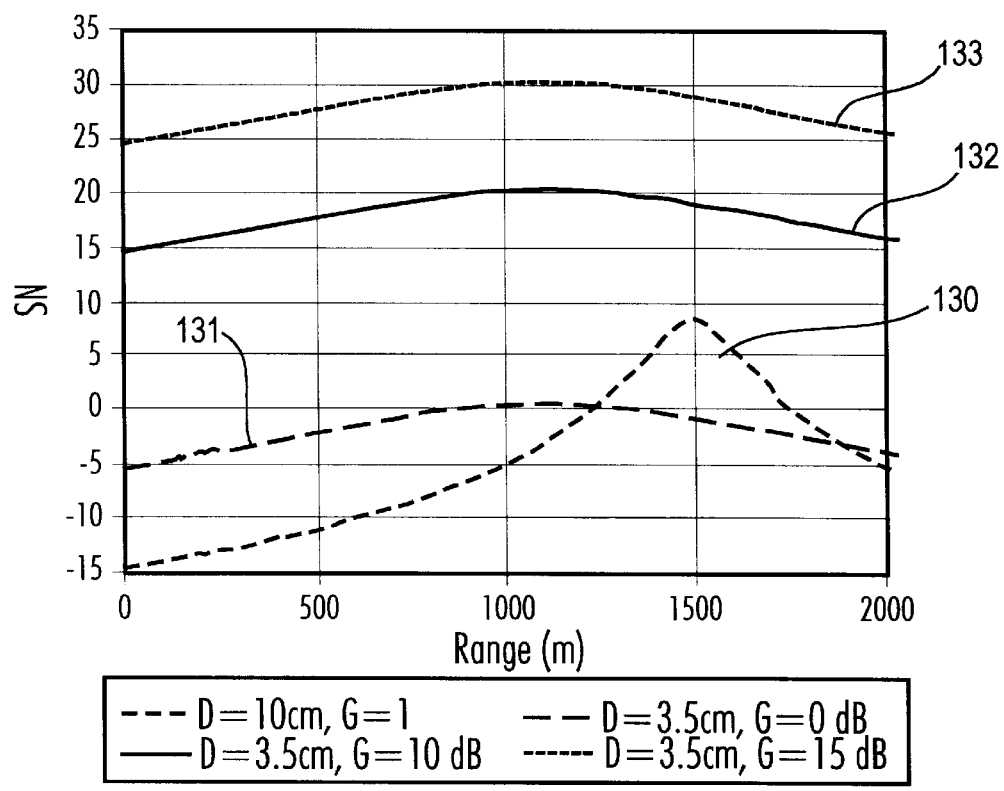
FIG. 17 shows the effects of focusing and range on SNR for four different cases.

Optimal selection of a beam expander can lead to an additional advantage of using an SDA in the system, since it can be used to lessen potentially stringent requirements on focusing the transmitted light close to an object, whose distance from the sensor is often not known. Self-mixing sensors have the highest sensitivity to scattered light when the optical system focuses the transmitted light on the object. If the object is not at this focus, the amount of light coupled back into the laser is reduced. As a result, the sensitivity can be strongly dependent on where the object is with respect to the beam focus. An example of this is illustrated in FIG. 17, where the anticipated signal-to-noise ratio (SNR) is plotted as a function of object distance from the sensor. Since exact calculations of SNR as a function of object distance depends on a number of factors, including object reflectivity, the exact shape and SNR values indicated are not meant as absolute indicators of performance. What is of interest is the general shape of the curves as well as the relative vertical position of the curves. The curve indicated by numeral 130 indicates SNR when an optical system is transmitting a laser beam with transverse diameter of approximately 10 cm, and the beam is focused at 1500 meters. It is clearly seen that the SNR is highest near 1500 meters and decreases rapidly if the object is not near that range. If instead a 3.5 cm diameter beam is transmitted, the resulting curve is indicated by numeral 131. That curve shows less variation with range, but it also indicates a smaller maximum value of the SNR. If an amplifier with a single-pass gain of 10 dB is added to the self-mixing sensor, that same 3.5 cm transmitted beam would give rise to the curve 132. This curve shows that only a small variation of SNR with object range, but the peak SNR value is higher than either of the two previous curves. If the single-pass gain is increased to 15 dB we obtain curve 133, which shows a further increase in SNR. Based upon these calculations it is clear that peak SNR can be traded off against insensitivity to object range variations. Such insensitivity is often desired to pre-empt the need for focusing mechanisms. As illustrated in FIG. 17, the use of an amplifier enables collateral use of a smaller beam expander than if no amplifier is used. This has the additional potential advantages of reducing the system size and cost.

Figure 18:
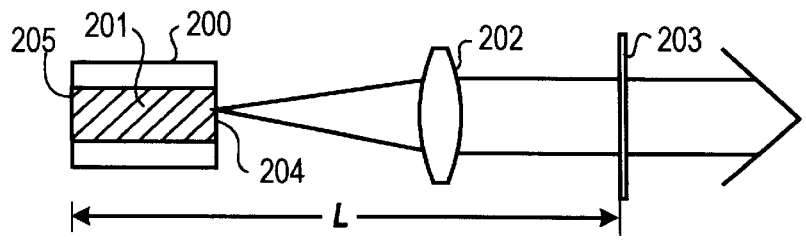
FIG. 18 shows the layout of a conventional external cavity diode laser.

The following provides a description of an improved sensor using a long laser and a long laser with a gain element. Equation 1 implies that the amount of acceptable feedback can be increased if the length of the laser is increased. Semiconductor diode lasers normally have a very short length, such as less than 1 mm. As a result they are more prone to exhibit EMH than longer lasers, such as helium-neon or carbon dioxide lasers. By making use of an external cavity, the effective length of a semiconductor laser can be increased. One way of making an external cavity laser is shown in FIG. 18. A diode laser chip 200 has an active gain region indicated by hatched area 201. The laser chip 200 emits light which is collected and collimated with lens 202 and directed to a partially reflecting mirror 203. The mirror reflects a fraction, such as 5%–50%, of the light back into the laser diode chip 200. Provided that the laser chip output surface 204 has a lower reflectivity than the reflectivity of mirror 203, and that laser chip facet 205 has a sufficiently higher reflectivity, such as greater than 30%, a laser with a length equal to the distance L indicated in FIG. 18 will be formed. This simple configuration is highly likely to operate on several longitudinal modes. This is because the gain of a semiconductor laser is high over a very wide range of frequencies, such as more than 100 GHz. The frequency separation of different longitudinal modes is much smaller for a long laser, such as 1.5 GHz for a laser cavity length of 10 cm. Many longitudinal modes (frequencies) then experience similar amounts of gain, and the device may lase at several frequencies. Such a device is not highly suitable for self-mixing sensors, unless its length is actively stabilized. Active stabilization adds considerable cost and complexity to the system. One approach disclosed here for incorporating a long cavity diode laser is shown in FIG. 19 and does not require such active stabilization techniques.

Figure 19:
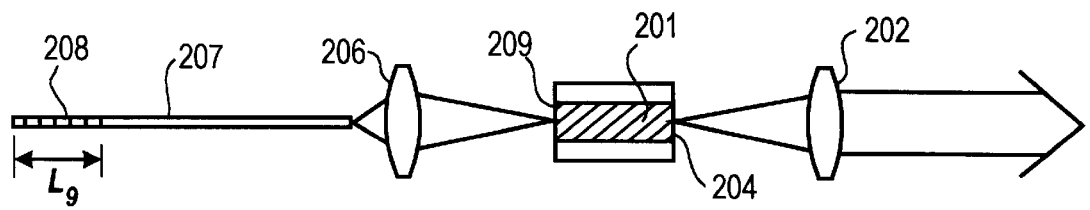
FIG. 19 shows an improved sensor using a long-cavity diode laser.

The device shown in FIG. 19 contains a semiconductor laser chip 200 with a gain region 201. Light is coupled out of the laser through a partially reflecting surface 204. This surface 204 preferably has a relatively low reflectivity, such as less than 15%. At the other end of the laser chip the surface 209 has a very low reflectivity, such as less than 0.1%. Light is coupled from the gain region into an optical fiber 207 for example through the use of an optical element, such as a lens 206. The optical fiber contains near the far end a grating 208, which permits strong reflection of only a narrow frequency spectrum. The frequency selectivity of the grating permits the laser to operate on a single longitudinal mode without requiring active stabilization of the cavity length. The required length of the fiber, and the length Lg of the grating section, is dependent on the anticipated object reflectivity and distance from the sensor, and may, e.g., be in the range of about 1 cm to >10 cm.

Figure 20:
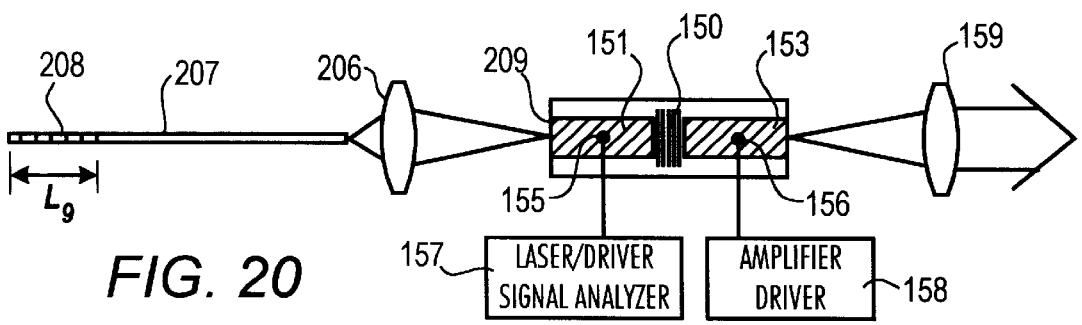
FIG. 20 shows a sensor element incorporating a long-cavity laser and an optical amplifier integrated with the laser.

It is also evident that a long cavity laser as described above can be combined with an attenuator or amplifier. A preferred way is to combine the long cavity laser with an amplifier placed on the same chip as the laser. A device of this type is shown in FIG. 20. In this figure the laser generally includes elements 150–151 and 153–159 as previously discussed in relation to FIG. 14. However, in place of reflector 152, the end facet is provided with a low reflectivity coating 209. Furthermore, the fiber optic assembly including elements 206–208 is also utilized to ensure a spectrally selective reflector for the laser. A long laser can also clearly be used in conjunction with liquid crystal and other attenuators.

The following provides a description of monolithic sensor arrays. Semiconductor lasers can easily be fabricated with multiple laser elements placed in parallel on a laser chip. deGroot has previously discussed the use of a sensor array which used a matching photo-detector array for detection of signals from multiple sources. Using a photo-detector array has significant drawbacks. First, it is likely to require considerable design to ensure the photo-detector elements operate in or close to the shot-noise limited regime. Second, the detector array may need to be carefully aligned in space so that light from a single sensor element falls on exactly one corresponding detector element. Even if this can be accomplished, there is great potential for spurious scattered light to cause cross-talk between elements, thereby degrading the resulting sensor imaging performance.

Figure 21:
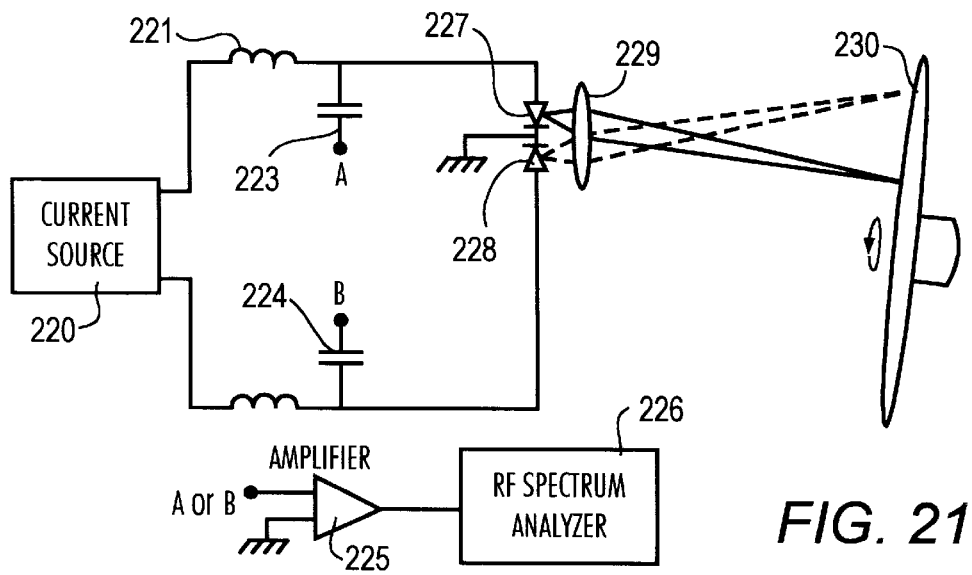
FIG. 21 is a schematic of a two-element sensor array using no photo detectors.
Figure 22A:
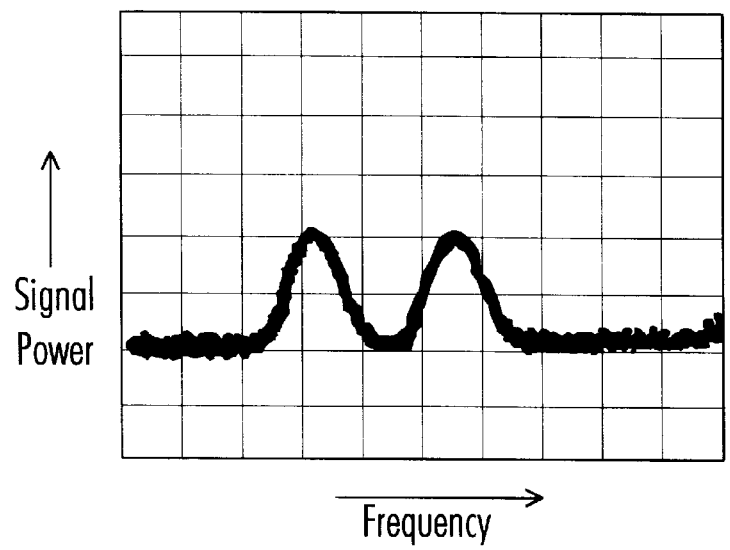
FIGS. 22a,b,c shows detection of both Doppler signals (a), and individual Doppler signals (b) and (c) using the implementation of FIG. 21.
Figure 22B:
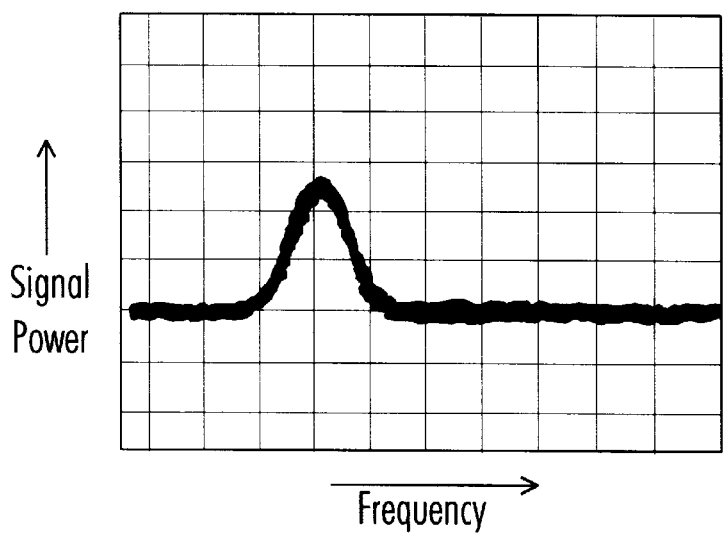
Figure 22C:
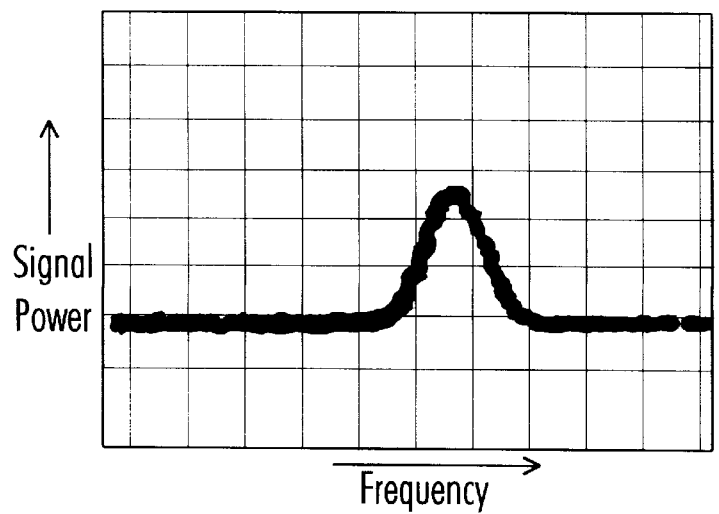

The arrangement shown in FIG. 21 eliminates the need for a photo-detector array, while still permitting an array of sensors to be operated from a single current source. A two-element sensor array is shown, although extensions to larger numbers of elements will be apparent to those of skill in the art after understanding the present disclosure. In the figure a current source 220 is used to drive two diode laser elements 227 and 228. Inductors 221 and 222 are used to permit direct current to flow through the lasers, while blocking high-frequency components. In practical chip level implementations of self-mixing array sensors, this function may be performed by an active low pass filter to obviate the need for physical inductors. Capacitors 223 and 224 present a low impedance at high frequencies and permit voltage fluctuations to be transmitted to an amplifier 225 and signal processor 226 by connection to points A or B for the two channels. FIG. 22 shows spectrum analyzer traces for an experimental configuration where this arrangement was used. The light from a 2-element array was imaged onto a rotating disk 230 (FIG. 21), using a lens 229 (FIG. 21) such that each scattered signal experienced a slightly different Doppler frequency shift. The spectral trace in FIG. 22a corresponds to connecting the amplifier and spectrum analyzer to both points A and B, which results in two spectral peaks corresponding to the two different speeds. Spectra corresponding to connection of the amplifier to points A and B in FIG. 21 are shown in FIGS. 22b and c. It is clear that this arrangement permits separate detection of each array element. It is also clear that there is no discernible crosstalk, since neither of FIGS. 22b or 22c shows any evidence of a peak at the location corresponding to the peak of the other figure. Using this arrangement a large number of array elements can be implemented. Each element can be decoupled from the others using low-pass filtering and each resulting channel can have its own amplifier and signal processing channel. Alternatively, a number of channels can multiplexed into a single amplifier/signal processor and each channel demodulated sequentially.

Although FIG. 21 illustrates a situation in which the sensed object was a spatially extended object, the present invention can also be used in connection with detecting motion, velocity or other characteristics of small objects such as small atmospheric particulates, dust or aerosol particles, and the like, e.g. particles with a longest dimension less than about 1–2 microns.

Single particles scatter light during their passage through the laser beam. The motion of the particle induces a sensor signal similar, but time-varying, to the signal from the solid target. Unlike a solid target, the signal from a particle has a short duration determined by the width of the laser beam, the proximity of the particle to the laser beam focus, and the particle speed. A particle that crosses the laser beam near the focus produces a much stronger signal than a same-size particle crossing the beam far from the beam focus. The term far refers to distance in units of the confocal beam parameter of the focused beam. Particles passing a distance of several confocal beam parameters from the focus may not produce a detectable signal and are not considered to be signal inducing. This range dependence of the signal strength provides a means of determining the approximate range from where signals originate, provided that similar size particles are present in the beam on subsequent detection events.

A small particle moving through a 0.2 mm wide beam at a speed of 10 m/s produces a signal for an approximate duration of 20 microseconds. Under many common circumstances, such as measuring the speed of a liquid or gas flow in which particles are entrained, the fraction of time particles are present relative to the time no signal-inducing particles are present in the beam is very small, for example less than 0.001. In order to be useful as a measurement instrument, the sensor should be equipped with a signal processing system that is capable of distinguishing the presence of particles. In the case of a high wideband SNR conditions this is possible by simply triggering a detection system (such as an oscilloscope) whenever the AC or DC signal level exceeds a predetermined threshold. When the wideband SNR is low but the narrowband SNR is modest to high, for example more than 3 dB, detection and processing system that substantially continuously measure the narrowband SNR as a function of frequency can be used to detect signals and calculate particle speeds. One example is a system that continuously calculates power spectra of the input signal and indicated the presence of a particle by detecting spectral features substantially above the background noise floor.

Figure 23:
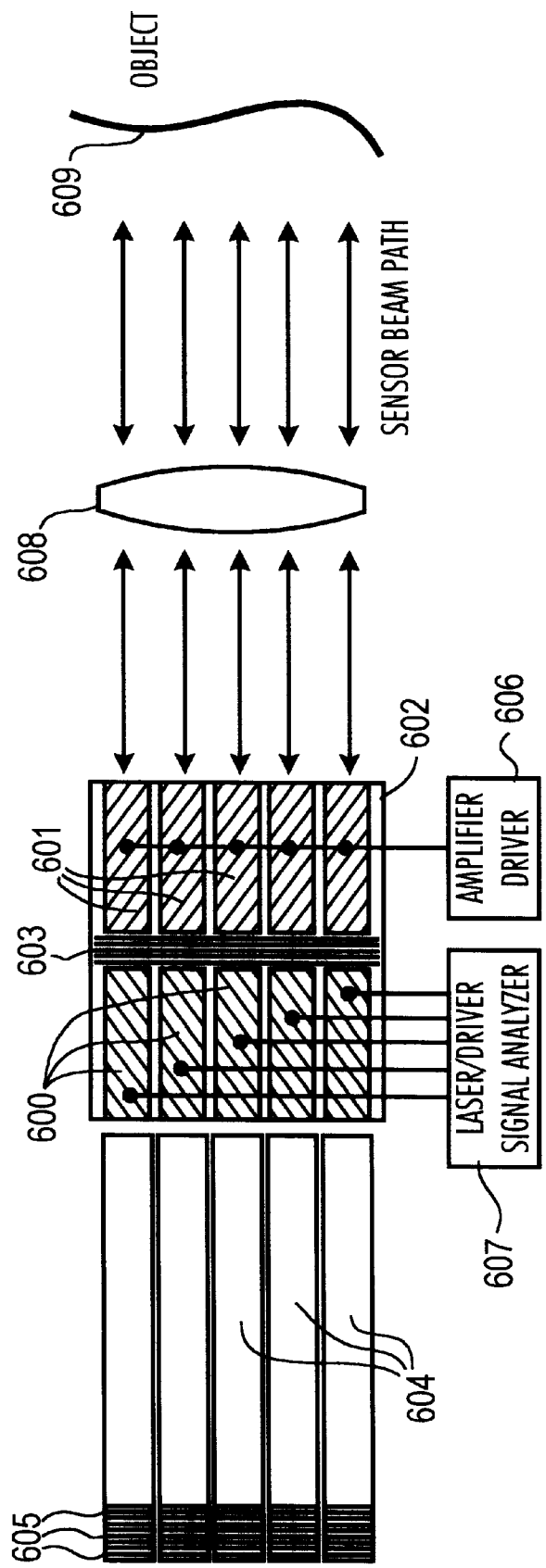
FIG. 23 is a conceptual architecture of an array sensor incorporating multiple laser and amplifier channels.

An array of sensors can also be fabricated with amplifiers and with long cavities. One implementation of a general amplified sensor array is illustrated in FIG. 23. In this configuration multiple laser (600) and amplifier (601) sections are preferably fabricated on a single substrate (602), the two sets of sections being separated by, for example, a grating (603). To provide for a set of long laser cavities, a set of optical fibers (604) are aligned with the laser sections in such a manner that each fiber interacts with a single laser/amplifier channel. The individual fibers may also contain gratings (605) to ensure single longitudinal mode operation of each channel. We also note that optical waveguide devices can be used in place of the optical fibers. In this configuration all amplifier sections may be driven in parallel from a single current source (606). The laser sections are preferentially also driven from a single current source (607), but each channel is also isolated with respect to high frequency impedance fluctuations in a manner similar to FIG. 21. As illustrated in FIG. 23 an optical system, such as a lens (608), is used to collect the light from each channel and direct it towards the object (609). In place of a single lens (608), a lens array could be used, such that each channel has connected to it a separate lens. Binary optics or holographic elements could also be used to image the array output onto an object.

The following provides a description of a method to achieve high reliability sensors. In order to be of practical use for many applications, a sensor should operate with high accuracy over a long period of time. For example, many industrial monitoring applications require speed accuracy of 0.1% with no measurable degradation over several-year time periods. Diode laser based sensors built as described in the prior art cannot produce such accuracy and reliability. All diode lasers used in the prior art have employed Fabry-Perot laser configurations wherein the laser cavity is formed by two parallel mirrors separated by a gain medium. If the cavity has an optical length L, the laser can potentially operate at frequencies given by $\{m*(c/2L)\}$, where m is an integer. The spacing between such potential frequencies is therefore c/2L, also known as the free spectral range. In a normal semiconductor laser the gain medium produces gain over a frequency range that is substantially larger than the free spectral range. As a result, such a Fabry-Perot laser may simultaneously operate at several different frequencies, and may also jump discontinuously between different frequencies. Since Doppler frequency is proportional to the wavelength or frequency of the light used, laser frequency uncertainties cause uncertainties in the measured Doppler frequency. In some instances such lasers may operate at a single frequency. This is sometimes due to unintentional perturbations, such as weak parasitic reflections from windows in the optical system, external to the laser cavity. Such parasitic reflections are usually not controllable or repeatable, and therefore there exists a fundamental uncertainty about the laser wavelength. Furthermore, even if a Fabry-Perot laser operates at a single frequency at a given time, there is no guarantee that it will operate at the same frequency after a significant period of time. Aging of the laser material can cause drifts of the laser frequency in an uncontrollable manner.

The present invention permits some or all of these problems to be circumvented, to enable the manufacture of practical, reliable self-mixing sensors, e.g. by employing a novel combination of a mode-selective laser with a self-mixing sensor. An important feature is that the self-mixing laser cavity has at least one element that imposes a differential loss between the different potential laser frequencies. By permitting one frequency to have a lower loss than all other potential frequencies, that one frequency will oscillate at a much higher power level than any other frequencies, e.g., by a factor of 100–10,000. Frequency exclusive self mixing sensors can be fabricated in several different manners using known laser topologies such as distributed Feedback (DFB), distributed Bragg reflector (DBR), and fiber Bragg grating (FBG) lasers, in addition to several other types. Such lasers use corrugations or gratings to achieve a low loss at one frequency and higher loss at other frequencies. A further advantage of using such lasers is that the frequency is determined primarily by the grating, rather than the semiconductor material. As a result, aging of the material, and thermal mounting and packaging variations, do not cause the same problem with frequency drift in frequency exclusive self mixing sensors as with previously demonstrated sensors using Fabry-Perot topology lasers.

Semiconductor lasers also change frequency with temperature. The tuning rate is normally of the order 0.05–0.3 nm/° C. In order to ensure that the laser frequency is kept within a suitable tolerance band, such as 0.01%, or 0.15 nm for a laser operating at 1500 nm, the temperature must be maintained to a specified set point within a corresponding temperature range. For the above example, the permissible temperature variation is preferably 0.3–3° C., depending on the tuning rate of the laser. Such temperature control can be implemented by connecting the laser to a suitable temperature controlled mount. In a preferred case such a mount includes a thermoelectric cooler and temperature sensor contained within the laser diode package.

A novel approach to laser temperature measurement uses the standard photodiode generally included on commercial laser substrates to facilitate laser power monitoring, as a temperature sensor. In this mode, a forward bias is applied across the photodiode, and the diode junction voltage drop is monitored to indicate diode laser substrate temperature. By alternately monitoring the forward bias voltage drop across the photodiode, and the reverse bias current through the photodiode, both the laser diode temperature and optical power may be monitored using the same device in intimate thermal contact with the laser diode.

The following provides a description of a technique for accurate linear speed measurements. Doppler sensors of the type described herein measure the radial speed of moving objects. If an object, such as a sheet of paper, is moving at a linear speed vo along an axis, and if a Doppler speed sensor is pointed at the object at an angle 0, the speed sensor will measure a radial speed $v=v_0 \cos(\theta)$. If the angle $\theta$ is not accurately known or varies with time, this will introduce errors in the measurement of the speed $v_0$. By using two sensors 235 and 236 to produce two laser beams 232 and 233, as shown in FIG. 24a, each one being incident at a different angle onto the surface 234, this problem can be eliminated, provided that the angle $\phi$ between the two beams is known. Since the incidence angles are $\theta_1$ and $\theta_2$, the two sensors measure speeds $V_1=V_0 \cos(\theta_1)$ and $V_2=V_0 \cos(\theta_2)=V_0 \cos(\theta_1+\phi)$. If we denote the ratio of the measured speeds as $x=v_2/v_1$, one can show that v is given by $$v = \frac{v_1}{\cos\left[\tan^{-1}\left(\frac{x\cos(\phi)-1}{x\sin(\phi)}\right)\right]} \quad (2)$$

This expression is not dependent on the individual angles $\theta_1$ and $\theta_2$. By measuring the two radial speeds and independently measuring the separation angle, the linear speed v of the object can be inferred. In practice this can be done by measuring the speeds using analog or digital methods. In the latter case the two speeds are converted to digital numbers and a microprocessor is used to calculate expression (2). The angle $\phi$ is easily measured to a precision of, for example, less than 1 mrad. Each of the speeds can be measured to a precision of 0.1% or better, which can then result in a linear speed measurement with, for example, 0.1% accuracy.

The speed can also be extracted from the two measured speeds $v_1$ and $v_2$ using the $$v = \frac{\sqrt{v_1^2+v_2^2-2v_1v_2\cos(\phi)}}{\sin(\phi)} \quad (3)$$

Likewise, orthogonal pairs of sensors operable to provide angle independent speed measurement as outlined above can be used to provide 2-D linear sheet speed independent of tilt and azimuthal orientation of the sensor planes to the sheet velocity.

FIG. 24b illustrates a system and method for providing automatic correction for pointing angle using a combination of a single-beam self-mixing sensor and inclinometers. In many industrial applications, where sensor cost is an issue, but high precision measurement is still needed, a single beam self-mixing sensor may be combined with one or more accelerometers, or other inclinometers, to effect angle corrected speed or measurement, for example. The beam from a self-mixing sensor 400 impinges on a moving target 405 at an angle α with respect to the target motion (assumed in the plane of the figure). An inclinometer 403 providing electrical signals proportional to inclination angle is affixed to the sensor and previously aligned so that the angle between the sensor beam and the inclinometer axis is precisely known. A second inclinometer 410 is similarly affixed to the target, or target support, as might be found on an assembly line conveyor belt. Signals from inclinometer 410 are transmitted by hardwire, RF, or optical link to memory 415 where the inclination angle of the target may be stored once during setup, or on a periodic basis as required. The most recent inclinometer 410 reading is conducted to a differencing circuit 420 where it is subtracted from the current inclinometer 403 readings of the sensor 400 inclination angle to determine the angle α. The cosine of the angle signal is taken by arithmetic function generator 425 and output to the multiplier 430. Meanwhile, the Doppler signal from sensor 400 is reduced to a velocity signal by the signal processor 435 and output to the multiplier 430. The output 435 of multiplier 430 provides the desired speed signal automatically corrected for the angle α. Signal processing to effect the angle correction can be performed on analog or digital representations of the Doppler and inclinometer signals as appropriate, by choosing the appropriate devices well known in the art. In an alternative embodiment, the inclinometer 410 may be a portable test jig which may be affixed temporarily to the target or its support during a calibration period. The target inclination can be stored in memory 415. This is useful where the target inclination is substantially fixed, but where the sensor orientation may be moved during maintenance, for example. Another embodiment employing a movable link between the target inclinometer (such as a flexible cable, or RF or optical link) and the memory 415, allows constant changes in the target orientation while still providing fully corrected speed measurements. This is useful in robotics applications, for instance.

The following provides a description of a technique for accurate linear speed measurements using a single laser source. A technical issue with using two lasers is the difficulty involved in maintaining the angle between two separate lasers to a sufficient level of accuracy, such as 0.1 milliradians. Because the angular extent of the emission from diode lasers is normally large, such as 25–30 degrees, a lens having a short focal length F, typically in the range of 2–10 mm, is used for collimation and focusing onto a target. The short focal length leads to a high sensitivity to transverse misalignments between the laser emission point and the optical axis of the lens. If a transverse displacement y takes place between the laser and optical axis of the lens, the pointing angle of the laser beam following the lens shifts by an approximate amount y/F. In order to maintain an angular shift of less than 1 milliradians, y/F must be less than 0.001. If F is 5 mm, this means that y must be less than 0.005 mm. This can be difficult to achieve in practice, particularly in the presence of temperature and other environmental variations within the system.

In an alternative embodiment that circumvents this problem, accurate linear speed measurements can also be carried out using a single laser source according to this invention. A preferred implementation is shown in FIG. 25. Here, the output beam from a laser 240 is split into two paths using a beam splitter 241 and a mirror 242. The two beams are directed to intersect a moving surface 234 at different angles. Light scattered from the two points on the object is scattered back into the laser, where it gives rise to several frequency spectrum components. Each Doppler frequency gives rise to its own individual frequency, $f_1$ and $f_2$. In addition, a frequency peak corresponding to the difference frequency $f_2-f_1$ is present. Determination of the speed v can then be done by measuring each of the two individual frequencies. Alternatively, one of the individual frequencies in conjunction with the difference frequency can be used.

Under relatively high feedback, each source at frequency $f_1$ gives rise to sidebands at multiples of the fundamental frequency. As a result, additional peaks will appear in the spectrum, e.g, at $(2f_2-f_1)$ and $(2f_1-f_2)$. In order for unambiguous speed detection to be possible, a knowledge of which peak is which, is needed. To aid in automating speed measurements, in an alternative embodiment, a shutter 243, for example, a mechanical device that may be flipped in and out of a laser beam path, or an electrically controlled liquid crystal attenuator, can be temporarily inserted into one of the laser beams. This eliminates the additional frequency peaks and permits a signal processor to lock onto the remaining lowest spectral peak, i.e., if beam 2 is blocked only frequency f, (and weaker harmonics thereof) is present. Once a servo has been used to lock to this peak, the second beam can be unblocked. A second processor can then be used to search for and lock onto either the second individual peak or to the difference frequency peak. The outputs from the two servos can then be used in conjunction with a microprocessor to calculate the linear speed using expression 2 above. Alternatively, sophisticated processing of the whole spectrum may be employed using DSP's or other hardware to decipher complex relationships between the spectral features.

Sophisticated processing (including analog techniques) can also be used to determine the sign of the velocity. Normally, Doppler shifted frequencies give no information regarding the direction of motion towards or away from the sensor. When a self-mixing signal is large enough, harmonic sidebands of the fundamental Doppler frequency are present. The sign of the second harmonic relative to the fundamental signal is indicative of the direction of motion. With signal processors that operate in the amplitude domain, such phase differences can be derived. It is also noted that conventional and well known techniques for deriving the velocity sign, such as inclusion of a frequency shifter to move the zero Doppler away from zero frequency, can also easily be incorporated into the present invention.

One advantage of this approach over using two lasers is that only a single angle between the two beams needs to be maintained with high accuracy. Motion between the lens and the laser as discussed above is no longer a critical issue, since both beam paths are affected by the same amount, and therefore the relative angle is not affected. A second advantage is that only a single laser is used, which reduces cost. A third advantage is that laser wavelength changes affect both frequency determinations to the same degree, reducing the measurement error in comparison with two lasers independently drifting in wavelength.

In using this technique, it makes a significant difference whether or not the two beams are physically overlapped on the surface of the object. We show in FIG. 26 several RF spectrum analyzer traces taken under several conditions.

Figure 26A:
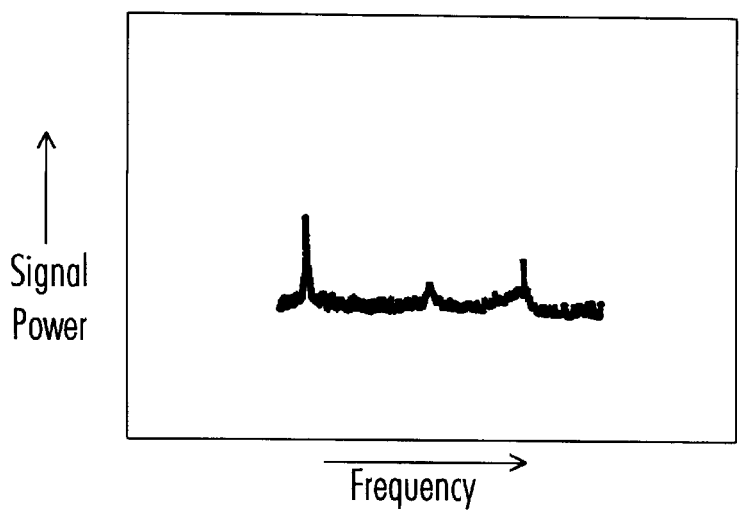
FIGS. 26a,b,c shows signal power (arbitrary but identical units) spectra versus frequency (arbitrary but identical units) such as from measurement of speed using the configuration of FIG. 25 when both beams are blocked (a), when the two beams do not overlap on the target (b), and when the two beams do overlap on the target (c).
Figure 26B:
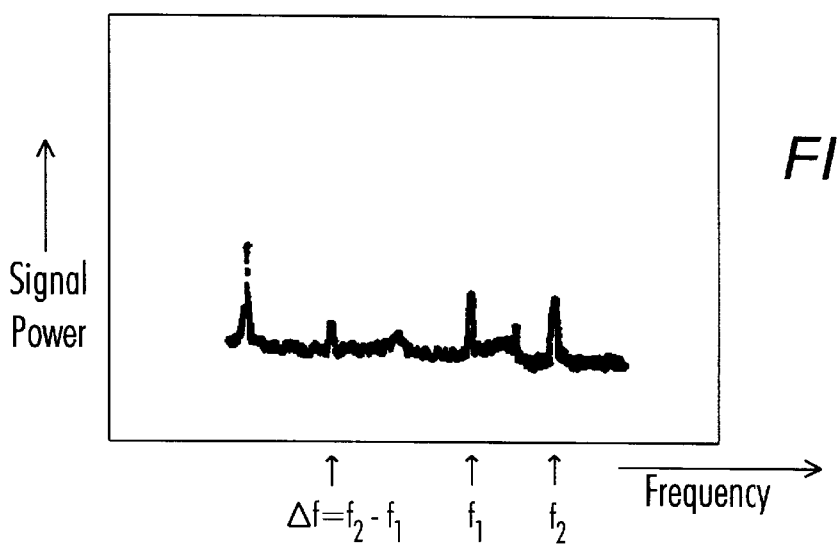
Figure 26C:
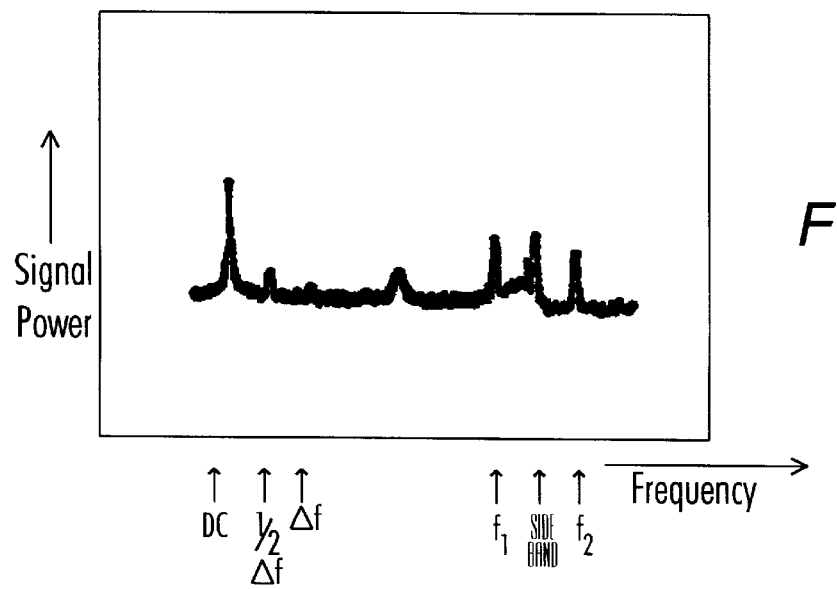

FIG. 26a shows the spectrum analyzer trace when both beams are blocked. The peaks seen are due to spurious pickup in the sensor system and therefore represent noise. FIG. 26b shows the spectrum when both beams are incident on the surface, but when the two beams are separated by at least one beam diameter. The two big peaks (denoted $f_1$ and $f_2$) to the right in the figure correspond to the two individual Doppler frequencies, while the smaller peak (denoted $\Delta f$) represents the difference frequency. FIG. 26c shows the spectrum when the two beams are made to physically overlap on the moving surface.

In addition to the peaks seen in FIG. 26b, an additional peak (denoted "sideband") can be seen between the individual Doppler peaks. A further peak (denoted ½$\Delta f$) can also be seen at low frequencies. These additional peaks are due to light transmitted through one beam to the target and received through the other beam back to the sensor. Analysis shows that the low frequency peak should be at ½ of the difference frequency peak, which can be seen from the figure. Analysis also predicts the peak centered between the two individual Doppler peaks. Because of the presence of these additional spectral features, it is often desirable to operate a two-beam sensor with non-overlapping beams. However, the extra information provided by the additional spectral peaks may also be useful, for example to indicate that a target is located in the beam intersection region.

The features of invention herein described include improvements over previous self-mixing sensor technology, and the novel constructions of self-mixing sensors and of self-mixing sensors in combinations with other devices enables significant performance enhancements, including greatly improved dynamic range and sensitivity.

While the above description contains many specifications, these should not be construed as limitations on the scope of the invention, but rather as examples of preferred embodiments thereof. Numerous variations and combinations of features are possible, including, but not limited to the following examples:

Any signal processing technique capable of determining a signal magnitude can be used to provide a feedback signal to an attenuator or amplifier driver, including analog servos, fast Fourier transform (FFT), fast Walsh transform (FWT), fast Walsh-Hadamard transform (FHT) and auto-correlation processors (including those using pulse-pair and poly-pulse-pair algorithms).

The technique of using an optical amplifier applies to any system where a laser and reasonably high gain medium is available, for example more than 5 dB, amplifiers can be constructed, including: carbon dioxide lasers; numerous solid-state lasers (including neodymium, erbium, ytterbium, and holmium lasers); and lasers used in conjunction with high gain nonlinear optical amplifiers (including optical parametric amplifiers).

Several alternative techniques exist to achieve a low reflectivity from the input and output ends of an amplifier, including the use of dielectric anti-reflection coatings, cleaving or polishing the end at an angle different from the normal to the light propagation path, and burying the facet or facets.

The technique of using a variable attenuator applies to any laser used in a self-mixing configuration.

Numerous ways of implementing a variable attenuator exist, including a variable iris (aperture), liquid crystal devices based on scattering light as opposed to altering the polarization state, electro-absorption modulators, rotating polarizers, and others.

An indirect way of implementing a variable attenuator is to misfocus the transmitted beam on the target, which can be implemented using a variable focus lens.

Signal detection techniques discussing detection of laser junction impedance variations can also be employed if detection of power fluctuations using an external detector is used.

If the laser is a gas laser, laser power fluctuations can be detected by measuring fluctuations in the current through or voltage across the laser tube.

Although single lenses are used in the figures to indicate means for collecting light from a laser and focusing the same on an object, more complex optics can be used for this purpose, including the use of separate optical elements for collimating light and subsequently expanding the beam and focusing it on or in the vicinity of the object.

The sensors are also functional if the light is not focused on the object, although the amount of signal is generally reduced in comparison with the focused case.

The technique of increasing the dynamic range using a long laser can also be implemented by using a laser with an external cavity including a grating, such as laser devices containing a grating mounted in the Littrow configuration.

The techniques discussed in the description apply to the generic sensor, not to a particular sensor use, such as speed or vibration sensing, or displacement measurements.

The apparatus shown in FIG. 25 is only one way of generating two beams from a single laser. Other methods include use of monolithic elements containing partially reflective mirror surfaces.

Embodiments of the present invention include a number of features including:

System and method for automatically controlling EMH in self-mixing sensor devices
angle independence of radial speed sensors using 2 or more beams
angle independence using inclinometer and self mixing laser device Control of self mixing laser device mode hopping using frequency selective laser cavity elements Laser amplifier with self mixing laser device to increase dynamic range Stable integral extended laser cavity construction of self mixing laser device sensor to control EMH and extend self-mixing laser device range Use of an optical amplifier as a variable attenuator as well as gain medium to increase self mixing laser device dynamic range Use of beam expander with Self mixing laser device to extend sensitivity range Elimination of cross-talk in sensor arrays by using laser diode as sources as sensors Temperature control using in-case photodiode or diode laser as a temperature sensing device, e.g. utilizing the temperature dependence of the voltage drop across the diode junction Length measurement using self mixing laser device Signal attenuation can also be effected through the use of variable beam distorters (for example liquid crystal devices or mechanical elements inserted into the laser beam) as well as through variable defocusing mechanisms (for example using a focusing lens attached to a voice coil, and defocusing the beam if the received signals are too high).

In one embodiment, an optical sensor includes a semiconductor diode laser, configured to operate substantially in a single longitudinal mode; means or devices for providing light from said semiconductor diode laser to a first region and coupling scattered light from said first region back into said semiconductor diode laser, wherein self-mixing is provided; means or devices for detecting variations related to said semiconductor diode laser in response to changes in said scattered light; and means or devices for controllably changing the amount of said light coupled back into said semiconductor laser.

In one embodiment, an optical sensing method includes transmitting light from a semiconductor diode laser to a first region, said semiconductor diode laser operating substantially in a single longitudinal mode; coupling scattered light from said first region back into said semiconductor diode laser, wherein self-mixing is provided; detecting variations related to said semiconductor diode laser in response to changes in said scattered light; and controllably changing the amount of said light coupled back into said semiconductor laser.

In one embodiment, a sensor includes means or devices for outputting at least first and second light beams, wherein said means or devices for outputting includes at least a first self-mixing laser; and means or devices for obtaining a linear velocity of a target, using said means or devices for outputting, which is substantially insensitive to the angle between said beams.

In one embodiment, a sensor apparatus includes a self-mixing laser; and stable integral extended laser cavity means or devices to control mode hopping of said self-mixing laser.

In one embodiment, a sensor apparatus includes a self-mixing laser; and stable integral extended laser cavity means or devices to extend range of said self-mixing laser.

In one embodiment, a sensor apparatus includes a self-mixing laser; and optical amplifier means or devices for providing variable attenuation.

In one embodiment, a sensor apparatus includes a self-mixing laser; and optical amplifier means or devices for providing variable gain.

In one embodiment, a sensor apparatus includes a plurality of laser diodes; and means or devices for reducing cross-talk among said plurality of laser diodes.

In one embodiment, a sensing method includes providing a self-mixing laser having at least a first laser diode; and using a diode junction voltage drop to monitor laser substrate temperature. In one embodiment, such a sensing method further includes using said diode junction voltage drop to monitor laser power.

In one embodiment, a self-mixing sensor includes a semiconductor diode laser and a lens, said laser having a laser cavity; and at least a first frequency selective means or device. In one embodiment, such a sensor is provided wherein said frequency selective means or device includes means or devices for imposing a differential loss between different potential laser frequencies. In one embodiment, such a sensor is provided further comprising a temperature monitor and cooling means or devices. In one embodiment, such a sensor further includes a frequency selective grating.

In one embodiment, a sensing method, includes providing a self-mixing sensor comprising a laser diode defining a laser diode junction; using said laser diode junction as a temperature monitor; and selectively cooling said self-mixing sensor in response to temperature sensed by said temperature monitor. In one embodiment, said grating is provided in an optical fiber coupled to said laser.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and\or reducing cost of implementation.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangable and/or equivalent structures, functions, ranges or steps to those claimed, whether or not such alternate, interchangable and/or equivalent structures, functions, ranges or steps are disclosed herein, and without intending to publicly dedicate any patentable subject matter.

The embodiments of the invention in which an exclusive property or privilege is claimed are defined as follows:

1. Self-mixing sensor apparatus, comprising: a laser source for generating first light; directing said first light to an object along a first axis, collecting second light scattered from said object back along said axis, and re-injecting said second light into said laser source;

detection means for detecting temporal variations of said first light as a result of interference with said second light;

estimating means for estimating the strength of said temporal variations;

transmission control means placed in the path of said first light capable of providing positive or negative changes in the transmission of said first light through said transmission control means, said changes in the transmission of light being controllable through electrical means; and electrical means for increasing or decreasing said light transmission in response to said estimation means.

2. Self-mixing sensor apparatus, comprising:

a laser source for generating first light; directing said first light to an object along a first axis, collecting second light scattered from said object back along said axis, and re-injecting said second light into said laser source;

wherein said laser source comprises a laser gain medium and at least one reflector means, at least a first reflector means having a reflectivity which varies substantially with the wavelength of light incident upon it;

detection means for detecting temporal variations of said first light resulting from interference with said second light; and estimating means for estimating the strength of said temporal variations.

3. Apparatus, as claimed in claim 2, wherein said means for estimating the strength of said temporal variations includes means selected from the group consisting of means for detecting phase of said first light;
   means for detecting amplitude of said first light;
   means for detecting frequency content of said first light;
   means for detecting temporal evolution of the amplitude of said first light;
   means for detecting the width-of-signal of said first light in spectral space;
   means for detecting the signal to noise ratio; and
   means for detecting the number of peaks per unit time of said first light.

4. Apparatus, as claimed in claim 2, wherein said laser source comprises a non-gas laser.

5. The self-mixing sensor apparatus of claim 4, wherein said detection means comprise a photo-detector to permit detection of temporal variations of the output power of said laser source.

6. The self-mixing sensor apparatus of claim 1, wherein said detection means comprise electronics means for indirectly detecting temporal variations of said first light by detecting variations of the voltage across, or electrical current through, the laser.

7. The self-mixing sensor apparatus of claim 1, wherein said transmission control means comprises an electrically variable aperture whose central hole is substantially centered on said first laser light beam.

8. The self-mixing sensor apparatus of claim 1, wherein said transmission control means comprises a liquid crystal device capable of rotating the polarization state of said first light in response to said electrical means.

9. The self-mixing sensor apparatus of claim 8, wherein a polarizer is placed between said liquid crystal device and said object.

10. The self-mixing sensor apparatus of claim 1, wherein said transmission control means comprises a liquid crystal device capable of scattering said first and said second light away from said first axis, and wherein the degree to which said light is scattered is controllable with said electrical means.

11. The self-mixing sensor apparatus of claim 1, wherein said transmission control means comprises an optical amplifier whose transmission gain or loss can be controlled through said electrical means.

12. The self-mixing sensor apparatus of claim 1, wherein said laser source is a semiconductor laser.

13. The self-mixing sensor apparatus of claim 1, wherein said detection means comprise a photo-detector to permit detection of temporal variations of the output power of said laser source.

14. The self-mixing sensor apparatus of claim 11, wherein said optical amplifier comprises an optical fiber amplifier.

15. The self-mixing sensor apparatus of claim 11, wherein said optical amplifier comprises an optical semiconductor amplifier.

16. The self-mixing sensor apparatus of claim 11, wherein said optical amplifier is placed in proximity of said laser source.

17. The self-mixing sensor apparatus of claim 15, wherein said optical semiconductor amplifier is fabricated on the same semiconductor substrate as said laser source.

18. The self-mixing sensor apparatus of claim 2, wherein said wavelength variable reflector means comprises a diffraction grating.

19. The self-mixing sensor apparatus of claim 2, wherein said wavelength variable reflector means comprises a fiber Bragg grating.

20. The self-mixing sensor apparatus of claim 2, wherein said laser source is a semiconductor laser.

21. The self-mixing sensor apparatus of claim 2, wherein the length of said laser source is greater than 1 mm.

22. The self-mixing sensor apparatus of claim 20, wherein the semiconductor laser comprises a semiconductor gain section having a partially transmitting facet at one end, and to whose other end is attached an optical fiber containing a fiber Bragg grating having a reflectivity at the emission wavelength of the semiconductor gain section.

23. The self-mixing sensor apparatus of claim 2, including transmission control means placed in the path of said first light capable of providing positive and/or negative changes in the transmission of said first light through said transmission control means, said changes in the transmission of light being controllable through electrical means;

and electrical means for increasing or decreasing said light transmission in response to said estimating means.

24. A sensor as claimed in claim 2 comprising at least a first inclinometer to determine a linear velocity.

25. The self-mixing sensor apparatus of claim 2, wherein said laser source is a distributed feedback laser.

26. A self-mixing sensor apparatus, as claimed in claim 2 wherein said laser source is a distributed Bragg reflector laser.

27. A self-mixing sensor apparatus, comprising:

a first laser which outputs at least first light and receives second light which includes at least a portion of said first light reflected from a target object;

circuitry coupled to said first laser, which outputs a signal related to temporal variations in at least a first parameter of said first laser;

a controllable variable light attenuator positioned along a light path between an output of said first laser and an input of said second light, said attenuator coupled to said signal to vary attenuation of said variable light attenuator in response to said signal.

28. Apparatus as claimed in claim 27 wherein said first parameter includes laser junction impedance changes.

29. Apparatus as claimed in claim 27 wherein said first parameter is indicative of the Doppler signal strength.

30. Apparatus as claimed in claim 27 wherein said attenuator is selected from the group consisting of:

liquid crystal attenuator;
a shutter;
an electro-absorption filter;
an electro-optic modulator;
movable polarizers;
an iris;
an optical amplifier;
an acousto-optic modulator;
a variable beam distorter;
a variable focus mechanism.

31. A self-mixing sensing method, comprising:

providing a first laser
providing first circuitry coupled to said first laser;
outputting at least first light from said first laser;
receiving second light in said first laser, said second light including at least a portion of said first light scattered from a target object;
outputting, from said first circuitry, a signal related to temporal variations in at least a first parameter of said first laser;
positioning a controllable variable light attenuator along a light path between an output of said first laser and an input of said second light,
controlling said attenuator, using said signal, to vary attenuation of said variable light attenuator in response to said signal.

32. A sensing method comprising:

providing a self-mixing laser;
positioning a controllable variable light attenuator to controllably attenuate light output from and/or input to said self-mixing laser;
increasing attenuation of said attenuator when the sum of a wideband signal and noise exceeds a threshold level.

33. An optical sensor, as claimed in claim 32, further comprising an external laser cavity, coupled to said semiconductor laser diode, including an optical fiber positioned on said substrate.

34. A sensing method comprising:

providing a self-mixing laser;
positioning a controllable variable light attenuator to controllably attenuate light output from or input to said self-mixing laser;
adjusting attenuation of said attenuator when a narrowband signal exceeds a threshold level.

35. A sensing method comprising:

providing a self-mixing laser;
positioning a controllable variable light attenuator to controllably attenuate light output from or input to said self-mixing laser;
calculating information related to a power spectrum of said self-mixing laser
reducing attenuation of said attenuator when a peak is undetected in said power spectrum.

36. An optical sensor comprising:

a semiconductor diode laser, configured to operate substantially in a single longitudinal mode;
an optical assembly configured to provide light from said semiconductor diode laser to a first region and to couple scattered light from said first region back into said semiconductor diode laser, wherein self-mixing is provided wherein variations occur in said semiconductor diode laser in response to changes in said scattered light;
an optical detector which detects said variations; and
an amplifier/attenuator positioned to change the amount of said scattered light which is coupled back into said semiconductor laser.

37. An optical sensor, as claimed in claim 36, wherein said optical assembly focuses light from said semiconductor laser in said first region.

38. An optical sensor, as claimed in claim 36 further comprising a magnitude detector coupled to said amplifier/attenuator to decrease the amount of light coupled back into said semiconductor laser when the magnitude detector indicates that the amount of light being coupled back into said semiconductor laser exceeds an upper threshold.

39. An optical sensor, as claimed in claim 38 wherein said upper threshold is selected to substantially avoid external-cavity mode hopping in said semiconductor laser.

40. An optical sensor, as claimed in claim 36, wherein said amplifier/attenuator includes a liquid crystal variable retarder.

41. An optical sensor, as claimed in claim 36, further comprising a magnitude detector coupled to said amplifier/attenuator to increase the amount of light coupled back into said semiconductor laser when the magnitude detector indicates that the amount of light being coupled back into said semiconductor laser is below a lower threshold.

42. An optical sensor, as claimed in claim 36, wherein said amplifier/attenuator includes a laser amplifier.

43. An optical sensor, as claimed in claim 36 wherein said amplifier/attenuator and said semiconductor diode laser are on a single substrate.

44. An optical sensor, as claimed in claim 36, wherein said variations related to said semiconductor diode laser include variations in output power.

45. An optical sensor, as claimed in claim 36, wherein said variations related to said semiconductor diode laser include variations in junction impedance.

46. An optical sensor, as claimed in claim 37, further comprising a beam expander positioned between said semiconductor diode laser and said first region.

47. An optical sensor, as claimed in claim 36, further comprising an external laser cavity coupled to said semiconductor diode laser.

48. An optical sensor, as claimed in claim 47, wherein said external laser cavity includes an optical fiber and a grating which is reflective in a first frequency range.

49. An optical sensor, as claimed in claim 48, wherein said first frequency range is such that the optical sensor operates in said single longitudinal mode without the need for active stabilization of cavity length.

50. An optical sensor comprising:

first and second semiconductor diode lasers;

an optical assembly configured to provide light from said first and second semiconductor diode lasers to first and second regions, respectively, and to couple scattered light from said first region to said first semiconductor diode laser and to couple scattered light from said second region to said second semiconductor diode laser, wherein self-mixing is provided; and an optical detector which detects variations related to each said semiconductor diode laser in response to changes in said scattered light.

51. An optical sensor, as claimed in claim 50, further comprising means for reducing cross-talk between said first and second semiconductor diode lasers.

52. An optical sensor, as claimed in claim 51, wherein said means for reducing cross- talk includes circuitry to detect temporal diode impedance variations.

53. An optical sensing method, comprising:

transmitting laser light to a target from first and second different directions separated by a first angle, using at least a first self-mixing semiconductor diode laser;

calculating a linear velocity of said target using said first angle, a first radial velocity obtained using said laser light from said first direction and a second radial velocity obtained using said laser light from said second direction.

54. A method, as claimed in claim 53 further comprising using a beam splitter to provide light from said first semiconductor diode laser in said first and second different directions.

55. A method, as claimed in claim 54, further comprising using an interrupter for determining which of two scattered light signals is obtained as a result of illumination from said first direction.

56. A sensor apparatus comprising:

a self-mixing laser;

means for automatically controlling mode hopping in said self-mixing laser.

57. A sensor as claimed in claim 56 wherein said means for automatically controlling mode hopping comprises frequency selective elements.

58. A sensor as claimed in claim 56 further comprising laser amplifier means for increasing dynamic range of said sensor.

59. A sensor as claimed in claim 56 further comprising beam expander means for extending sensitivity range of said sensor.

60. Self-mixing sensor apparatus, comprising: a laser source for generating first light; directing said first light to an object along a first axis, collecting second light scattered from said object back along said axis, and re-injecting said second light into said laser source;

detection means for detecting temporal variations of said first light as a result of interference with said second light;

estimating means for estimating the strength of said temporal variations;

transmission control means placed in the path of said first light capable of providing attenuation of said first light through said transmission control means.

* * * * *